United States Patent
Zia et al.

(10) Patent No.: US 12,393,898 B1
(45) Date of Patent: Aug. 19, 2025

(54) MACHINE LEARNING BASED SYSTEMS AND METHODS FOR OPTIMIZING JOB EFFICIENCY BASED ON GENERATION OF PREDETERMINED MOTION TIME SYSTEM (PMTS) REPRESENTATIONS FOR TASKS ASSOCIATED WITH JOBS

(71) Applicant: RETROCAUSAL, INC., Redmond, WA (US)

(72) Inventors: Muhammad Zeeshan Zia, Sammamish, WA (US); Quoc-Huy Tran, Redmond, WA (US); Andrey Konin, Redmond, WA (US)

(73) Assignee: Retrocausal, Inc., Redmond, WA (US)

( * ) Notice: Subject to any disclaimer, the term of this patent is extended or adjusted under 35 U.S.C. 154(b) by 0 days.

(21) Appl. No.: 18/814,775

(22) Filed: Aug. 26, 2024

Related U.S. Application Data

(60) Provisional application No. 63/649,329, filed on May 18, 2024.

(51) Int. Cl.
  *G06Q 10/0631* (2023.01)
  *G06F 30/20* (2020.01)

(52) U.S. Cl.
  CPC ....... *G06Q 10/06316* (2013.01); *G06F 30/20* (2020.01)

(58) Field of Classification Search
  CPC .......................... G06Q 10/06316; G06F 30/20
  See application file for complete search history.

(56) References Cited

U.S. PATENT DOCUMENTS

| | | | |
|---|---|---|---|
| 9,734,464 B2* | 8/2017 | Angell | G06Q 10/04 |
| 10,679,307 B2* | 6/2020 | Dewalt | G06Q 10/06398 |
| 11,068,831 B2* | 7/2021 | Arao | G05B 15/02 |
| 12,056,641 B2* | 8/2024 | Shah | G01C 21/3664 |
| 12,093,022 B2* | 9/2024 | Akella | G06Q 10/06398 |
| 2010/0094687 A1* | 4/2010 | Waggaman, III | G06Q 10/06 705/7.42 |
| 2016/0171633 A1* | 6/2016 | DeWalt | G06Q 10/06398 705/7.15 |
| 2021/0228942 A1* | 7/2021 | Erkkilä | G16H 50/20 |

* cited by examiner

*Primary Examiner* — Dylan C White
(74) *Attorney, Agent, or Firm* — Jason C. Cameron

(57) ABSTRACT

A ML-based method and system for optimizing job efficiency based on generation of predetermined motion time system (PMTS) representations for tasks associated with jobs, is disclosed. The ML-based method includes: obtaining description data corresponding to the tasks associated with the jobs, in representations comprising at least one of: text representations, image representations, video representations, and CAD representations; generating the PMTS representations of the tasks associated with the jobs, based on the obtained description data corresponding to the tasks associated with the jobs, using a machine learning model; generating insights corresponding to the tasks associated with the jobs, based on PMTS representations of the tasks associated with the jobs, using the machine learning model; and converting one PMTS representation to another PMTS representation, using the machine learning model.

17 Claims, 13 Drawing Sheets

MACHINE LEARNING BASED SYSTEMS AND METHODS FOR OPTIMIZING JOB EFFICIENCY BASED ON GENERATION OF PREDETERMINED MOTION TIME SYSTEM (PMTS) REPRESENTATIONS FOR TASKS ASSOCIATED WITH JOBS

CROSS-REFERENCE TO RELATED APPLICATION(S)

This application claims the priority to incorporate by reference the entire disclosure of U.S. Provisional Patent Application No. 63/649,329, filed on May 18, 2024, and titled "System and Method for Generating Motion and Time Studies for Productivity, Safety, And Quality".

FIELD OF INVENTION

Embodiments of the present disclosure relate to machine learning based (ML-based) systems, and more particularly relates to a machine learning based (ML-based) method and system for optimizing work/job efficiency based on generation of one or more predetermined motion time system (PMTS) representations for one or more tasks associated with one or more jobs.

BACKGROUND

Predetermined Motion Time Systems (PMTS) are a set of industrial engineering techniques used to analyze and standardize the time required to perform specific tasks. These systems break down work into basic human motions and assign a predetermined time to each motion based on empirical data. PMTS are essential for establishing fair and efficient work standards, improving productivity, and consistently evaluating performance.

PMTS involves a detailed analysis of work tasks. Each task is decomposed into its constituent basic motions, including at least one of: reaching, grasping, moving, positioning, and the like. These basic motions are often referred to as elemental motions. Each elemental motion may have a predetermined time value, usually derived from extensive research and empirical observations. These time values are typically expressed in some atomic time unit such as the Time Measurement Units (TMUs) where 1 TMU equals 0.00001 hours or 0.036 seconds, or as Minutes of Operation Delay (MODs), where 1 MOD equals 0.00215 minutes or 0.129 seconds, or by some other standard. By assigning standardized times to each basic motion, the PMTS provides a consistent and objective method to determine the time required for various tasks. This standardization may be crucial for establishing reliable work standards across different workers and work conditions.

The PMTS may help companies set fair and accurate time standards for tasks. These standards are used for planning, scheduling, and setting performance benchmarks. By having predefined times, companies may ensure that workers are judged based on standardized criteria, leading to fairer performance evaluations. With the PMTS, the companies may identify inefficiencies in work processes. By analyzing and optimizing the sequence of motions, the companies may streamline workflows and enhance productivity. The PMTS may further help in designing tasks that minimize unnecessary motions, reducing worker fatigue and increasing efficiency. The PMTS provides a consistent framework for evaluating worker performance. Since the time standards are based on empirical data, the PMTS may offer an objective basis for performance measurement. The consistency is vital for setting realistic targets, providing feedback, and motivating employees.

Though, the PMTS helps in increasing work efficiency in the companies/industries, representation of a physical process with PMTS symbols may be a tedious task. Each motion must be accurately identified, categorized, and recorded using the appropriate symbols and time values. This detailed analysis may require significant time and effort, making the initial implementation of PMTS labor-intensive. Once a process is represented using PMTS, extracting actionable insights and value may be challenging. Interpreting data to identify inefficiencies, optimize workflows, and implement improvements, may require a deep understanding of a system and a specific work context.

Hence, there is a need for an improved machine learning based (ML-based) system and method for optimizing work/job efficiency based on generation of one or more predetermined motion time system (PMTS) representations for one or more tasks associated with one or more jobs, in order to address the aforementioned issues.

SUMMARY

This summary is provided to introduce a selection of concepts, in a simple manner, which is further described in the detailed description of the disclosure. This summary is neither intended to identify key or essential inventive concepts of the subject matter nor to determine the scope of the disclosure.

In accordance with an embodiment of the present disclosure, a machine-learning based (ML-based) method for optimizing work/job efficiency based on generation of one or more predetermined motion time system (PMTS) representations for one or more tasks associated with one or more jobs, is disclosed. The ML-based method comprises obtaining, by one or more hardware processors, one or more description data corresponding to the one or more tasks associated with the one or more jobs, in one or more representations comprising at least one of: one or more text representations, one or more image representations, one or more video representations, and one or more computer-aided design (CAD) representations.

The ML-based method further comprises generating, by the one or more hardware processors, the one or more predetermined motion time system (PMTS) representations of the one or more tasks associated with the one or more jobs, based on the obtained one or more description data corresponding to the one or more tasks associated with the one or more jobs, using a machine learning model.

The ML-based method further comprises generating, by the one or more hardware processors, one or more insights corresponding to the one or more tasks associated with the one or more jobs, based on the one or more predetermined motion time system (PMTS) representations of the one or more tasks associated with the one or more jobs, using the machine learning model. The one or more insights corresponding to the one or more tasks associated with the one or more jobs, comprise at least one of: time assigned to the one or more tasks associated with the one or more jobs, one or more motion types during performing the tasks, one or more ergonomic risk factors due to the performance of the one or more tasks, and one or more recommendations of productivity in the one or more jobs.

The ML-based method further comprises converting, by the one or more hardware processors, the one or more predetermined motion time system (PMTS) representations to one or more second predetermined motion time system (PMTS) representations, using the machine learning model.

In an embodiment, the ML-based method further comprises training, by the one or more hardware processors, the machine learning model. Training the machine learning model comprises: (a) obtaining, by the one or more hardware processors, one or more description datasets comprising at least one of: the one or more text representations, the one or more image representations, the one or more video representations, and the one or more computer-aided design (CAD) representations, corresponding to the one or more tasks associated with the one or more jobs; (b) obtaining, by the one or more hardware processors, one or more pairwise datasets comprising the one or more jobs in the one or more descriptions datasets and one or more predetermined motion time system (PMTS) symbol streams associated with the one or more tasks; (c) adding, by the one or more hardware processors, the one or more description datasets with the one or more pairwise datasets, using a mixer; (d) training, by the one or more hardware processors, the machine learning model to determine one or more first optimized weights for the machine learning model, based on the addition of the one or more description datasets and the one or more pairwise datasets, using an optimizer with one or more objective functions; and (e) generating, by the one or more hardware processors, the one or more predetermined motion time system (PMTS) representations of the one or more tasks associated with the one or more jobs, based on the trained machine learning model with the determined one or more first optimized weights.

In another embodiment, generating the one or more predetermined motion time system (PMTS) representations of the one or more tasks associated with the one or more jobs, comprises: (a) obtaining, by the one or more hardware processors, the one or more description data corresponding to the one or more tasks associated with the one or more jobs, in one or more representations comprising at least one of: the one or more text representations, the one or more image representations, the one or more video representations, and the one or more computer-aided design (CAD) representations; (b) obtaining, by the one or more hardware processors, one or more first information comprising one or more details of how one or more predetermined motion time systems (PMTS) describing the one or more jobs as one or more first prompts within a first context window; (c) adding, by the one or more hardware processors, the one or more description data corresponding to the one or more tasks associated with the one or more jobs, with the one or more first information, using the mixer; (d) applying, by the one or more hardware processors, the addition of the one or more description data corresponding to the one or more tasks associated with the one or more jobs, with the one or more first information, into the machine learning model, wherein the machine learning model is trained for conversion of the one or more tasks associated with the one or more jobs, to the one or more predetermined motion time system (PMTS) representations, wherein the machine learning model is trained using meta-learning, and wherein the machine learning model is trained on one or more internal data to determine one or more subsequent words associated with the one or more tasks; and (e) generating, by the one or more hardware processors, the one or more predetermined motion time system (PMTS) representations of the one or more tasks associated with the one or more jobs, based on the machine learning model trained on one or more general purpose data.

In yet another embodiment, generating the one or more predetermined motion time system (PMTS) representations of the one or more tasks associated with the one or more jobs, comprises: (a) obtaining, by the one or more hardware processors, the one or more description data corresponding to the one or more tasks associated with the one or more jobs, in one or more representations comprising at least one of: the one or more text representations, the one or more image representations, the one or more video representations, and the one or more computer-aided design (CAD) representations; (b) generating, by the one or more hardware processors, one or more first vector representations of the one or more description data corresponding to the one or more tasks associated with the one or more jobs, using the machine learning model; (c) determining, by the one or more hardware processors, one or more first nearest neighbors associated with the one or more tasks by comparing the generated one or more first vector representations of the one or more description data corresponding to the one or more tasks, with one or more first original representations of the one or more tasks stored in one or more vector databases; and (d) generating, by the one or more hardware processors, the one or more predetermined motion time system (PMTS) representations of the one or more tasks associated with the one or more jobs, based on the determination of the one or more first nearest neighbors associated with the one or more tasks.

In yet another embodiment, the ML-based method further comprises training, by the one or more hardware processors, the machine learning model. Training the machine learning model comprises: (a) obtaining, by the one or more hardware processors, the one or more description datasets comprising at least one of: the one or more text representations, the one or more image representations, the one or more video representations, and the one or more computer-aided design (CAD) representations, corresponding to the one or more tasks associated with the one or more jobs; (b) obtaining, by the one or more hardware processors, the one or more pairwise datasets comprising the one or more jobs in the one or more descriptions datasets and the one or more predetermined motion time system (PMTS) symbol streams associated with the one or more tasks; (c) adding, by the one or more hardware processors, the one or more description datasets with the one or more pairwise datasets, using the mixer; (d) training, by the one or more hardware processors, the machine learning model to generate the one or more first vector representations of the one or more description data corresponding to the one or more tasks, wherein the one or more vector representations are numerical representations where one or more positions of one or more vectors corresponding to at least one of: the one or more description datasets and the one or more pairwise datasets, carrying one or more semantic meanings; and (e) storing, by the one or more hardware processors, a pair of the one or more description datasets of the one or more tasks associated with the one or more jobs and the one or more predetermined motion time system (PMTS) symbol streams, and the one or more first vector representations, in the one or more vector databases.

In yet another embodiment, the ML-based method further comprises: (a) obtaining, by the one or more hardware processors, one or more first datasets comprising the one or more predetermined motion time system (PMTS) representations of the one or more tasks associated with the one or more jobs; (b) obtaining, by the one or more hardware processors, one or more second datasets comprising the one or more insights from the one or more predetermined motion time systems (PMTS); (c) adding, by the one or more hardware processors, the one or more first datasets with the one or more second datasets, using the mixer; (d) training, by the one or more hardware processors, the machine learning model to determine one or more second optimized weights for the machine learning model, based on the addition of the one or more first datasets and the one or more second datasets, using the optimizer with one or more objective functions; and (e) generating, by the one or more hardware processors, the one or more insights corresponding to the one or more tasks associated with the one or more jobs, based on the trained machine learning model with the determined one or more second optimized weights.

In yet another embodiment, generating the one or more insights corresponding to the one or more tasks associated with the one or more jobs, comprises: (a) obtaining, by the one or more hardware processors, one or more second information comprising the one or more predetermined motion time system (PMTS) representations of the one or more tasks associated with the one or more jobs; (b) obtaining, by the one or more hardware processors, one or more third information comprising one or more details of how one or more predetermined motion time system (PMTS) representations are converted to the one or more insights as one or more second prompts within a second context window; (c) adding, by the one or more hardware processors, the one or more second information with the one or more third information, using the mixer; (d) applying, by the one or more hardware processors, the addition of the one or more second information with the one or more third information, into the machine learning model; and (e) generating, by the one or more hardware processors, the one or more insights corresponding to the one or more tasks associated with the one or more jobs, based on the machine learning model trained on the one or more second information comprising the one or more predetermined motion time system (PMTS) representations of the one or more tasks associated with the one or more jobs.

In yet another embodiment, generating the one or more insights corresponding to the one or more tasks associated with the one or more jobs, comprises: (a) obtaining, by the one or more hardware processors, the one or more second information comprising the one or more predetermined motion time system (PMTS) representations of the one or more tasks associated with the one or more jobs; (b) generating, by the one or more hardware processors, one or more second vector representations of the one or more second information comprising the one or more predetermined motion time system (PMTS) representations of the one or more tasks associated with the one or more jobs, using the machine learning model; (c) determining, by the one or more hardware processors, one or more second nearest neighbors associated with the one or more insights by comparing one or more second vector representations of the one or more second information, with one or more second original representations of the one or more insights stored in the one or more vector databases; and (d) generating, by the one or more hardware processors, the one or more insights corresponding to the one or more tasks associated with the one or more jobs, based on the determination of the one or more second nearest neighbors associated with the one or more insights.

In yet another embodiment, the ML-based method further comprising: training, by the one or more hardware processors, the machine learning model. Training the machine learning model comprises: (a) obtaining, by the one or more hardware processors, the one or more first datasets comprising the one or more predetermined motion time system (PMTS) representations of the one or more tasks associated with the one or more jobs; (b) obtaining, by the one or more hardware processors, the one or more second datasets comprising the one or more insights from the one or more predetermined motion time systems (PMTS); (c) adding, by the one or more hardware processors, the one or more first datasets with the one or more second datasets, using the mixer; (d) training, by the one or more hardware processors, the machine learning model to generate the one or more second vector representations of the one or more first datasets comprising the one or more predetermined motion time system (PMTS) representations of the one or more tasks associated with the one or more jobs; and (e) storing, by the one or more hardware processors, a pair of the one or more predetermined motion time system (PMTS) representations of the one or more tasks associated with the one or more jobs and the one or more insights, and the one or more second vector representations, in the one or more vector databases.

In yet another embodiment, the ML-based method further comprising: (a) obtaining, by the one or more hardware processors, the one or more first datasets comprising the one or more predetermined motion time system (PMTS) representations of the one or more tasks associated with the one or more jobs; (b) obtaining, by the one or more hardware processors, the one or more third datasets comprising the one or more second predetermined motion time system (PMTS) representations of the one or more tasks associated with the one or more jobs, wherein the one or more third datasets are pairwise datasets corresponding to the one or more second datasets; (c) adding, by the one or more hardware processors, the one or more first datasets with the one or more third datasets, using the mixer; (d) training, by the one or more hardware processors, the machine learning model to determine one or more third optimized weights for the machine learning model, based on the addition of the one or more first datasets and the one or more third datasets, using the optimizer with one or more objective functions; and (e) converting, by the one or more hardware processors, the one or more predetermined motion time system (PMTS) representations to the one or more second predetermined motion time system (PMTS) representations, using the machine learning model.

In yet another embodiment, converting the one or more predetermined motion time system (PMTS) representations to the one or more second predetermined motion time system (PMTS) representations, comprises: (a) obtaining, by the one or more hardware processors, the one or more first datasets comprising the one or more predetermined motion time system (PMTS) representations of the one or more tasks associated with the one or more jobs; (b) obtaining, by the one or more hardware processors, one or more fourth information comprising one or more details of how one or more predetermined motion time system (PMTS) representations are converted to the one or more second predetermined motion time system (PMTS) representations as one or more third prompts within a third context window; (c) adding, by the one or more hardware processors, the one or more first datasets with the one or more fourth information, using the mixer; (d) applying, by the one or more hardware processors, the addition of the one or more first datasets with the one or more fourth information, into the machine learning model; and (e) converting, by the one or more hardware processors, the one or more predetermined motion time system (PMTS) representations to the one or more second predetermined motion time system (PMTS)

representations, based on the machine learning model trained on the one or more general purpose data.

In yet another embodiment, converting the one or more predetermined motion time system (PMTS) representations to the one or more second predetermined motion time system (PMTS) representations, comprises: (a) obtaining, by the one or more hardware processors, the one or more first datasets comprising the one or more predetermined motion time system (PMTS) representations of the one or more tasks associated with the one or more jobs; (b) generating, by the one or more hardware processors, one or more third vector representations of the one or more first datasets comprising the one or more predetermined motion time system (PMTS) representations of the one or more tasks associated with the one or more jobs, using the machine learning model; (c) determining, by the one or more hardware processors, one or more third nearest neighbors associated with the one or more predetermined motion time system (PMTS) representations of the one or more tasks associated with the one or more jobs, by comparing one or more third vector representations of the one or more first datasets, with one or more third original representations of the one or more predetermined motion time system (PMTS) representations stored in the one or more vector databases; and (d) converting, by the one or more hardware processors, the one or more predetermined motion time system (PMTS) representations to the one or more second predetermined motion time system (PMTS) representations, based on the determination of the one or more third nearest neighbors associated with the one or more predetermined motion time system (PMTS) representations of the one or more tasks associated with the one or more jobs.

In yet another embodiment, the ML-based method further comprising training, by the one or more hardware processors, the machine learning model. Training the machine learning model comprises: (a) obtaining, by the one or more hardware processors, the one or more first datasets comprising the one or more predetermined motion time system (PMTS) representations of the one or more tasks associated with the one or more jobs; (b) obtaining, by the one or more hardware processors, the one or more third datasets comprising the one or more second predetermined motion time system (PMTS) representations of the one or more tasks associated with the one or more jobs; (c) adding, by the one or more hardware processors, the one or more first datasets with the one or more third datasets, using the mixer; (d) training, by the one or more hardware processors, the machine learning model to generate the one or more third vector representations of at least one of: the one or more first datasets, and the one or more third datasets; and (e) storing, by the one or more hardware processors, a pair of the one or more predetermined motion time system (PMTS) representations of the one or more tasks associated with the one or more jobs and the one or more second predetermined motion time system (PMTS) representations of the one or more tasks associated with the one or more jobs, and the one or more third vector representations, in the one or more vector databases.

In one aspect, a machine learning based (ML-based) system for optimizing job efficiency based on generation of one or more predetermined motion time system (PMTS) representations for one or more tasks associated with one or more jobs, is disclosed. The ML-based system includes one or more hardware processors and a memory coupled to the one or more hardware processors. The memory includes a plurality of subsystems in the form of programmable instructions executable by the one or more hardware processors.

The plurality of subsystems comprises a data obtaining subsystem configured to obtain one or more description data corresponding to the one or more tasks associated with the one or more jobs, in one or more representations comprising at least one of: one or more text representations, one or more image representations, one or more video representations, and one or more computer-aided design (CAD) representations.

The plurality of subsystems further comprises a predetermined motion time system (PMTS) representation generating subsystem configured to generate the one or more predetermined motion time system (PMTS) representations of the one or more tasks associated with the one or more jobs, based on the obtained one or more description data corresponding to the one or more tasks associated with the one or more jobs, using a machine learning model.

The plurality of subsystems further comprises an insights generating subsystem configured to generate one or more insights corresponding to the one or more tasks associated with the one or more jobs, based on the one or more predetermined motion time system (PMTS) representations of the one or more tasks associated with the one or more jobs, using the machine learning model. The one or more insights corresponding to the one or more tasks associated with the one or more jobs, comprise at least one of: time assigned to the one or more tasks associated with the one or more jobs, one or more motion types during performing the tasks, one or more ergonomic risk factors due to the performance of the one or more tasks, and one or more recommendations of productivity in the one or more jobs.

The plurality of subsystems further comprises a predetermined motion time system (PMTS) representation converting subsystem configured to convert the one or more predetermined motion time system (PMTS) representations to one or more second predetermined motion time system (PMTS) representations, using the machine learning model.

In another aspect, a non-transitory computer-readable storage medium having instructions stored therein that, when executed by a hardware processor, causes the processor to perform method steps as described above.

To further clarify the advantages and features of the present disclosure, a more particular description of the disclosure will follow by reference to specific embodiments thereof, which are illustrated in the appended figures. It is to be appreciated that these figures depict only typical embodiments of the disclosure and are therefore not to be considered limiting in scope. The disclosure will be described and explained with additional specificity and detail with the appended figures.

BRIEF DESCRIPTION OF DRAWINGS

The disclosure will be described and explained with additional specificity and detail with the accompanying figures in which.

Figure 1:
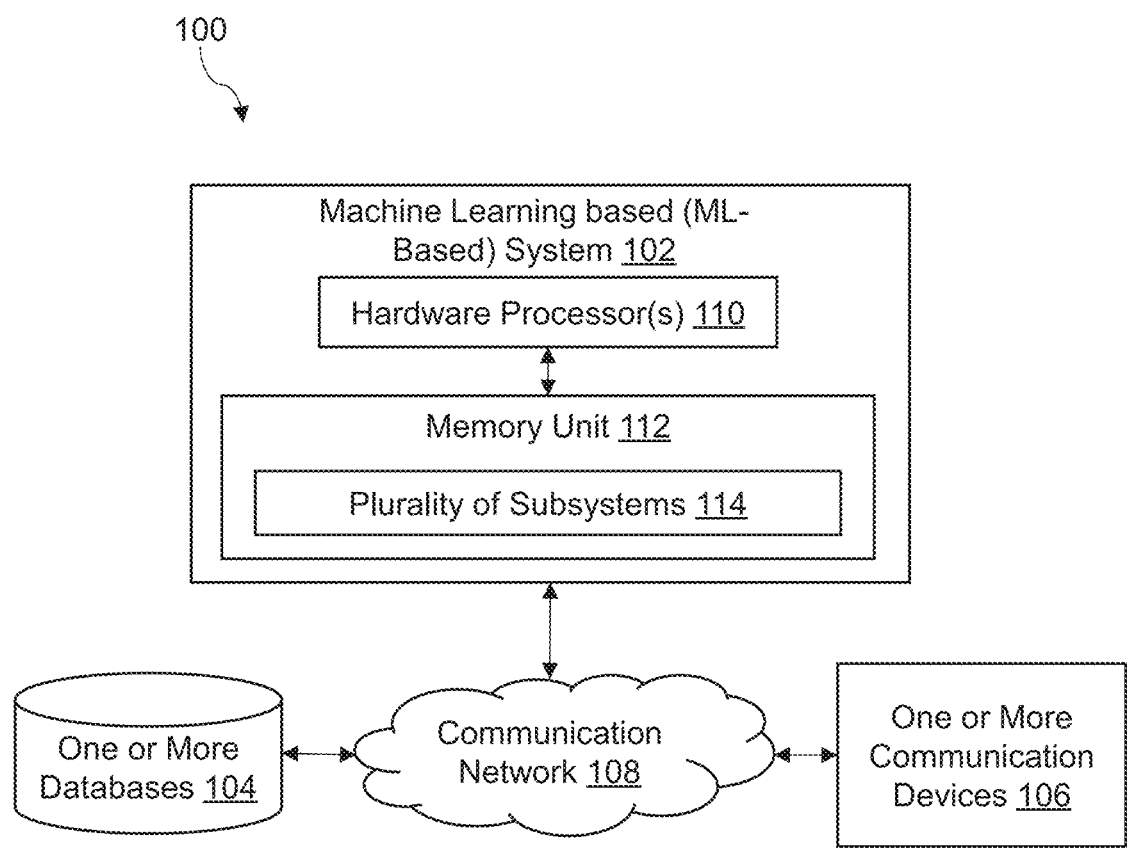
FIG. 1 is a block diagram illustrating a computing environment with a machine learning based (ML-based) system for optimizing work/job efficiency based on generation of one or more predetermined motion time system (PMTS) representations for one or more tasks associated with one or more jobs, in accordance with an embodiment of the present disclosure.

Further, those skilled in the art will appreciate that elements in the figures are illustrated for simplicity and may not have necessarily been drawn to scale. Furthermore, in terms of the construction of the device, one or more components of the device may have been represented in the figures by conventional symbols, and the figures may show only those specific details that are pertinent to understanding the embodiments of the present disclosure so as not to obscure the figures with details that will be readily apparent to those skilled in the art having the benefit of the description herein.

DETAILED DESCRIPTION OF THE DISCLOSURE

For the purpose of promoting an understanding of the principles of the disclosure, reference will now be made to the embodiment illustrated in the figures and specific language will be used to describe them. It will nevertheless be understood that no limitation of the scope of the disclosure is thereby intended. Such alterations and further modifications in the illustrated system, and such further applications of the principles of the disclosure as would normally occur to those skilled in the art are to be construed as being within the scope of the present disclosure. It will be understood by those skilled in the art that the foregoing general description and the following detailed description are exemplary and explanatory of the disclosure and are not intended to be restrictive thereof.

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

The terms "comprise", "comprising", or any other variations thereof, are intended to cover a non-exclusive inclusion, such that one or more devices or sub-systems or elements or structures or components preceded by "comprises . . . a" does not, without more constraints, preclude the existence of other devices, sub-systems, additional sub-modules. Appearances of the phrase "in an embodiment", "in another embodiment" and similar language throughout this specification may, but not necessarily do, all refer to the same embodiment.

Unless otherwise defined, all technical and scientific terms used herein have the same meaning as commonly understood by those skilled in the art to which this disclosure belongs. The system, methods, and examples provided herein are only illustrative and not intended to be limiting.

A computer system (standalone, client or server computer system) configured by an application may constitute a "module" (or "subsystem") that is configured and operated to perform certain operations. In one embodiment, the "module" or "subsystem" may be implemented mechanically or electronically, so a module includes dedicated circuitry or logic that is permanently configured (within a special-purpose processor) to perform certain operations. In another embodiment, a "module" or "subsystem" may also comprise programmable logic or circuitry (as encompassed within a general-purpose processor or other programmable processor) that is temporarily configured by software to perform certain operations.

Accordingly, the term "module" or "subsystem" should be understood to encompass a tangible entity, be that an entity that is physically constructed, permanently configured (hardwired) or temporarily configured (programmed) to operate in a certain manner and/or to perform certain operations described herein.

Referring now to the drawings, and more particularly to FIG. 1 through FIG. 17, where similar reference characters denote corresponding features consistently throughout the figures, there are shown preferred embodiments and these embodiments are described in the context of the following exemplary system and/or method.

FIG. 1 is a block diagram illustrating a computing environment 100 with a machine learning based (ML-based) system 102 for optimizing work/job efficiency based on generation of one or more predetermined motion time system (PMTS) representations for one or more tasks associated with one or more jobs, in accordance with an embodiment of the present disclosure. According to FIG. 1, The ML-based system 102 may be communicatively coupled to the one or more databases 104, and the one or more communication devices 106 via a communication network 108. The communication network 108 may be a wired communication network and/or a wireless communication network. The one or more databases 104 may include, but not limited to, storing, managing, and organizing data related to various aspects of an operation of the ML-based system 102.

The present invention is configured to optimize work efficiency based on the generation of the one or more predetermined motion time system (PMTS) representations for the one or more tasks associated with the one or more work (i.e., jobs), using a machine learning model. In an embodiment, the terms "works" and "jobs" may be used interchangeably throughout the description. The ML-based system 102 is initially configured to obtain one or more description data corresponding to the one or more tasks associated with the one or more jobs, in one or more representations including at least one of: one or more text representations, one or more image representations, one or more computer-aided (CAD) representations (e.g., as computer code), and one or more video representations.

The ML-based system 102 is further configured to generate the one or more predetermined motion time system (PMTS) representations of the one or more tasks associated with the one or more jobs, based on the obtained one or more description data corresponding to the one or more tasks associated with the one or more jobs, using the machine learning model.

The ML-based system 102 is further configured to generate one or more insights corresponding to the one or more tasks associated with the one or more jobs, based on the one or more predetermined motion time system (PMTS) representations of the one or more tasks associated with the one or more jobs, using the machine learning model. In an embodiment, the one or more insights corresponding to the one or more tasks associated with the one or more jobs, may be generated based on the one or more predetermined motion time system (PMTS) representations that are generated by an embodiment. In another embodiment, the one or more insights corresponding to the one or more tasks associated with the one or more jobs, may be generated based on the one or more predetermined motion time system (PMTS) representations that are manually provided by one or more users. In an embodiment, the one or more insights corresponding to the one or more tasks associated with the one or more jobs, may include at least one of: time assigned to the one or more tasks associated with the one or more jobs, one or more motion types during performing the tasks, one or more ergonomic risk factors due to the performance of the one or more tasks, and one or more recommendations of productivity in the one or more jobs.

The ML-based system 102 is further configured to convert the one or more predetermined motion time system (PMTS) representations to one or more second predetermined motion time system (PMTS) representations, using the machine learning model. In another embodiment, the one or more second predetermined motion system (PMTS) representation may be generated from a predetermined motion time system (PMTS) that is manually provided by the one or more users.

The one or more databases 104 may be any kind of databases including, but not limited to, relational databases, non-relational databases, graph databases, document databases, dedicated databases, dynamic databases, monetized databases, scalable databases, cloud databases, distributed databases, any other databases, and a combination thereof. The one or more databases 104 is configured to support the functionality of the ML-based system 102 and enables efficient data retrieval and storage for various aspects associated with at least one of: the generation of the one or more predetermined motion time system (PMTS) representations, the generation of the one or more insights based on the one or more predetermined motion time system (PMTS) representations, and the conversion of the one or more predetermined motion time system (PMTS) representations into the one or more second predetermined motion time system (PMTS) representations.

The ML-based system 102 may be hosted on a central server including at least one of: a cloud server or a remote server. In an embodiment, the ML-based system 102 may include at least one of: a user device, a server computer, a server computer over the communication network 108, a cloud-based system, a cloud-based system over the communication network 108, a distributed system, and the like. Further, the communication network 108 may be at least one of: a Wireless-Fidelity (Wi-Fi) connection, a hotspot connection, a Bluetooth connection, a local area network (LAN), a wide area network (WAN), any other wireless network, and the like.

In an embodiment, the one or more communication devices 106 may include at least one of: a laptop computer, a desktop computer, a tablet computer, a Smartphone, a wearable device, a Smart watch, and the like. Furthermore, the one or more communication devices 106 include at least one of: a local browser, a mobile application, and the like. Furthermore, a web application may be used through the local browser and the mobile application to communicate with the ML-based system 102. In an embodiment of the present disclosure, the ML-based system 102 includes a plurality of subsystems 114. Details on the plurality of subsystems 114 have been elaborated in subsequent paragraphs of the present description with reference to FIG. 2.

Further, the ML-based system 102 may be implemented by way of a single device or a combination of multiple devices that may be operatively connected or networked together. The ML-based system 102 may be implemented in hardware or a suitable combination of hardware and software. The ML-based system 102 includes one or more hardware processors 110, and a memory unit 112. The memory unit 112 may include the plurality of subsystems 114. The ML-based system 102 may be a hardware device including the one or more hardware processors 110 executing machine-readable program instructions for optimizing work/job efficiency based on generation of the one or more predetermined motion time system (PMTS) representations.

The one or more hardware processors 110 may include, for example, microprocessors, microcomputers, microcontrollers, digital signal processors, central processing units, state machines, logic circuits, and/or any devices that manipulate data or signals based on operational instructions. Among other capabilities, the one or more hardware processors 110 may fetch and execute computer-readable instructions in the memory unit 112 operationally coupled with the ML-based system 102 for performing tasks such as data processing, input/output processing, and/or any other functions. Any reference to a task in the present disclosure may refer to an operation being or that may be performed on data.

Though a few components and subsystems are disclosed in FIG. 1, there may be additional components and subsystems which is not shown, such as, but not limited to, ports, routers, repeaters, firewall devices, network devices, databases, network attached storage devices, servers, assets, machinery, instruments, facility equipment, emergency management devices, image capturing devices, any other devices, and combination thereof. A person skilled in the art should not be limiting the components/subsystems shown in FIG. 1.

Those of ordinary skilled in the art will appreciate that the hardware depicted in FIG. 1 may vary for particular implementations. For example, other peripheral devices such as an optical disk drive and the like, local area network (LAN), wide area network (WAN), wireless (e.g., wireless-fidelity (Wi-Fi)) adapter, graphics adapter, disk controller, input/output (I/O) adapter also may be used in addition or place of the hardware depicted. The depicted example is provided for explanation only and is not meant to imply architectural limitations concerning the present disclosure.

Those skilled in the art will recognize that, for simplicity and clarity, the full structure and operation of all data processing systems suitable for use with the present disclosure are not being depicted or described herein. Instead, only so much of the ML-based system 102 as is unique to the present disclosure or necessary for an understanding of the present disclosure is depicted and described. The remainder of the construction and operation of the ML-based system 102 may conform to any of the various current implementations and practices that were known in the art.

Figure 2:
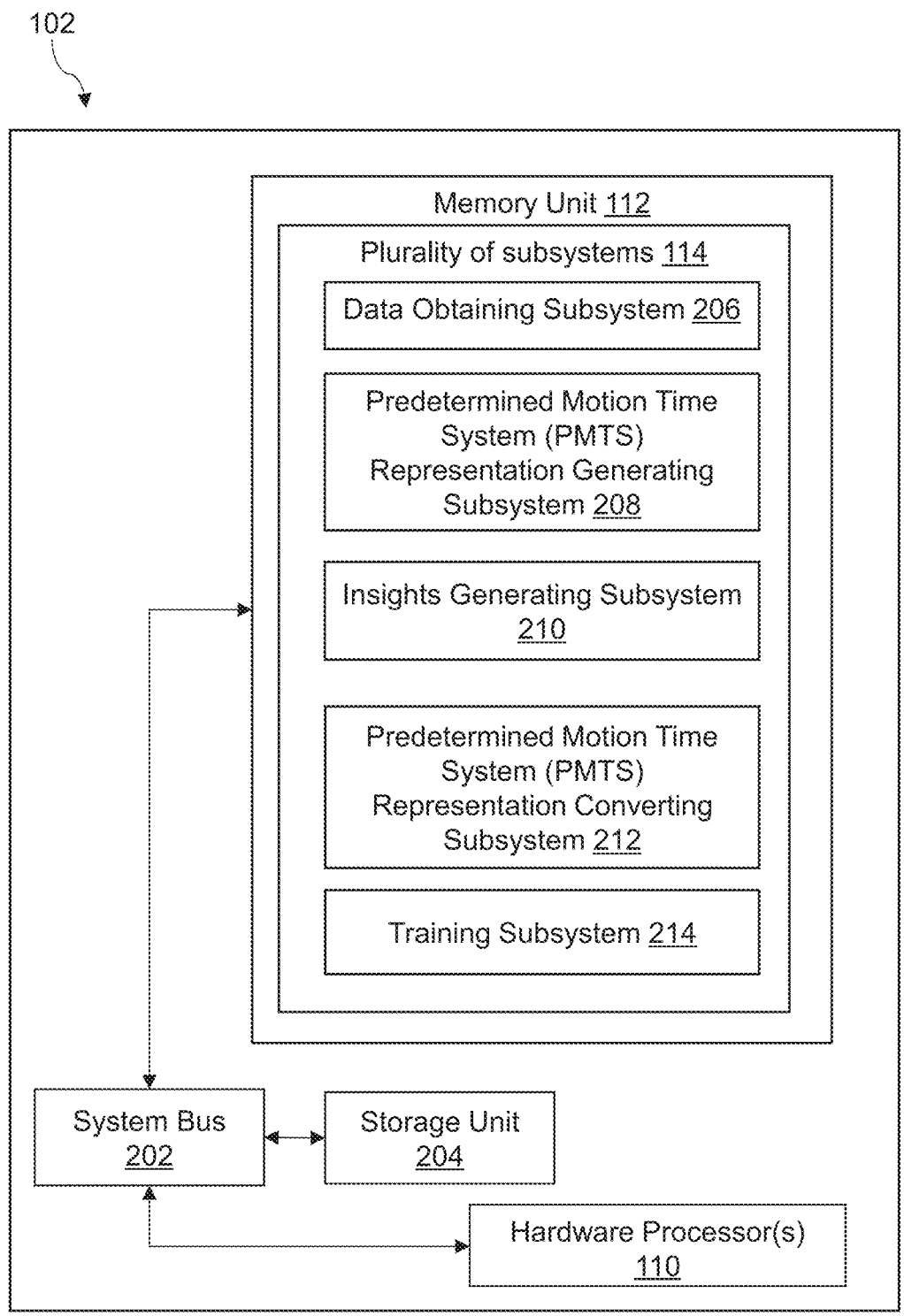
FIG. 2 is a detailed view of the ML-based system for optimizing work/job efficiency based on generation of the one or more predetermined motion time system (PMTS) representations for the one or more tasks associated with the one or more jobs, in accordance with another embodiment of the present disclosure.

FIG. 2 is a detailed view of the ML-based system 102 for optimizing work/job efficiency based on generation of the one or more predetermined motion time system (PMTS) representations for the one or more tasks associated with the one or more jobs, in accordance with another embodiment of the present disclosure.

The ML-based system 102 includes the memory 112, the one or more hardware processors 110, and a storage unit 204. The memory 112, the one or more hardware processors 110, and the storage unit 204 are communicatively coupled through a system bus 202 or any similar mechanism. The memory 112 includes the plurality of subsystems 114 in the form of programmable instructions executable by the one or more hardware processors 110.

The plurality of subsystems 114 includes a data obtaining subsystem 206, a Predetermined Motion Time System (PMTS) representation generating subsystem 208, an insights generating subsystem 210, a Predetermined Motion Time System (PMTS) representation converting subsystem 212, and a training subsystem 214.

The one or more hardware processors 110, as used herein, means any type of computational circuit, including, but not limited to, at least one of: a microprocessor unit, microcontroller, complex instruction set computing microprocessor unit, reduced instruction set computing microprocessor unit, very long instruction word microprocessor unit, explicitly parallel instruction computing microprocessor unit, graphics processing unit, digital signal processing unit, or any other type of processing circuit. The one or more hardware processors 110 may also include embedded controllers, including at least one of: generic or programmable logic devices or arrays, application specific integrated circuits, single-chip computers, and the like.

The memory 112 may be non-transitory volatile memory and non-volatile memory. The memory 112 may be coupled for communication with the one or more hardware processors 110, being a computer-readable storage medium. The one or more hardware processors 110 may execute machine-readable instructions and/or source code stored in the memory 112. A variety of machine-readable instructions may be stored in and accessed from the memory 112. The memory 112 may include any suitable elements for storing data and machine-readable instructions, including at least one of: read only memory, random access memory, erasable programmable read only memory, electrically erasable programmable read only memory, a hard drive, a removable media drive for handling compact disks, digital video disks, diskettes, magnetic tape cartridges, memory cards, and the like. In the present embodiment, the memory 202 includes the plurality of subsystems 114 stored in the form of machine-readable instructions on any of the above-mentioned storage media and may be in communication with and executed by the one or more hardware processors 110.

The storage unit 204 may be a cloud storage, a Structured Query Language (SQL) data store, a noSQL database or a location on a file system directly accessible by the plurality of subsystems 114.

The plurality of subsystems 114 includes the data obtaining subsystem 206 that is communicatively connected to the one or more hardware processors 110. The data obtaining subsystem 206 is configured to obtain the one or more description data corresponding to the one or more tasks associated with the one or more jobs, in one or more representations including at least one of: the one or more text representations, the one or more image representations, and one or more video representations, and the one or more computer-aided design (CAD) representations. In an embodiment, the one or more description data may include, for example, industrial assembly work described as text or video, computer-based work described as cursor-movements against a screen, or packaging work in a warehouse described via step-by-step pictorial instructions.

The plurality of subsystems 114 further includes the Predetermined Motion Time System (PMTS) representation generating subsystem 208 that is communicatively connected to the one or more hardware processors 110. The Predetermined Motion Time System (PMTS) representation generating subsystem 208 is configured to generate the one or more predetermined motion time system (PMTS) representations of the one or more tasks associated with the one or more jobs, based on the obtained one or more description data corresponding to the one or more tasks associated with the one or more jobs, using the machine learning model. The one or more predetermined motion time system (PMTS) representations may include at least one of: Modular Arrangement of Predetermined Time Standards (MODAPTS), Methods-Time Measurement (MTM) including at least one of: MTM-1, MTM-2, Methods-Time Measurement Universal Analysis System (MTM-UAS), Methods-Time Measurement Manual Evaluation Kit (MTM-MEK), and the like, and Maynard Operation Sequence Technique (MOST) including at least one of: MiniMost, MaxiMost, and the like. In an embodiment, the one or more PMTS representations may be pseudo-code or full code (e.g., in Python or C #programming or other programming languages for a Discrete Event Simulator).

The plurality of subsystems 114 further includes the training subsystem 214 that is communicatively connected to the one or more hardware processors 110. The training subsystem 214 is configured to train the machine learning model. In an embodiment, the machine learning model may include at least one of: a linear regression model, a logistic regression model, a decision tree model, a random forest model, a support vector machines (SVM) model, a neural network model, and the like.

For training the machine learning model, the training subsystem 214 is configured to obtain the one or more description datasets including at least one of: the one or more text representations, the one or more image representations, the one or more video representations, and the one or more computer-aided design (CAD) representations, corresponding to the one or more tasks associated with the one or more jobs.

The training subsystem 214 is further configured to obtain one or more pairwise datasets including the one or more jobs in the one or more descriptions datasets and one or more predetermined motion time system (PMTS) symbol streams associated with the one or more tasks. The training subsystem 214 is further configured to add the one or more description datasets with the one or more pairwise datasets, using a mixer.

The training subsystem 214 is further configured to train the machine learning model to determine one or more first optimized weights for the machine learning model, based on the addition of the one or more description datasets and the one or more pairwise datasets, using an optimizer with one or more objective functions. The training subsystem 214 is further configured to generate the one or more predetermined motion time system (PMTS) representations of the one or more tasks associated with the one or more jobs, based on the trained machine learning model with the determined one or more first optimized weights.

In an embodiment of the present disclosure, the Predetermined Motion Time System (PMTS) representation generating subsystem 208 is configured to obtain the one or more description data corresponding to the one or more tasks associated with the one or more jobs, in one or more representations including at least one of: the one or more text representations, the one or more image representations, the one or more video representations, and the one or more computer-aided design (CAD) representations. The Predetermined Motion Time System (PMTS) representation generating subsystem 208 is further configured to obtain one or more first information including one or more details of how one or more predetermined motion time systems (PMTS) describing the one or more jobs as one or more first prompts within a first context window.

The Predetermined Motion Time System (PMTS) representation generating subsystem 208 is further configured to add the one or more description data corresponding to the one or more tasks associated with the one or more jobs, with the one or more first information, using the mixer. The Predetermined Motion Time System (PMTS) representation generating subsystem 208 is further configured to apply the addition of the one or more description data corresponding to the one or more tasks associated with the one or more jobs, with the one or more first information, into the machine learning model. In an embodiment, the machine learning model may include at least one of: a large language model (LLM), a vision language model (VLM), and the like.

In an embodiment, the machine learning model is trained for conversion of the one or more tasks associated with the one or more jobs, to the one or more predetermined motion time system (PMTS) representations. The machine learning model is trained using meta-learning. In an embodiment, the machine learning model is trained on one or more internal data to determine one or more subsequent words associated with the one or more tasks. In other words, the machine learning model may be trained on general purpose internal data to predict the next word or more generally token and then fine-tuned on a dataset of instruction data. The Predetermined Motion Time System (PMTS) representation generating subsystem 208 is further configured to generate the one or more predetermined motion time system (PMTS) representations of the one or more tasks associated with the one or more jobs, based on the machine learning model trained on one or more general purpose data.

In an embodiment of the present disclosure, for generating the one or more Predetermined Motion Time System (PMTS) representations, the Predetermined Motion Time System (PMTS) representation generating subsystem 208 is configured to obtain the one or more description data corresponding to the one or more tasks associated with the one or more jobs, in one or more representations including at least one of: the one or more text representations, the one or more image representations, the one or more video representations, and the one or more computer-aided design (CAD) representations. The Predetermined Motion Time System (PMTS) representation generating subsystem 208 is configured to generate one or more first vector representations of the one or more description data corresponding to the one or more tasks associated with the one or more jobs, using the machine learning model.

The Predetermined Motion Time System (PMTS) representation generating subsystem 208 is configured to determine one or more first nearest neighbors associated with the one or more tasks by comparing the generated one or more first vector representations of the one or more description data corresponding to the one or more tasks, with one or more first original representations of the one or more tasks stored in one or more vector databases. In some embodiments, the one or more works and/or the PMTS representations may be segmented into one or more components and be matched on a component-by-component basis and translate from the one or more components. In other embodiments, the one or more work and/or the PMTS representations may be matched directly as a whole.

The Predetermined Motion Time System (PMTS) representation generating subsystem 208 is configured to generate the one or more predetermined motion time system (PMTS) representations of the one or more tasks associated with the one or more jobs, based on the determination of the one or more first nearest neighbors associated with the one or more tasks.

The training subsystem 214 is configured to train the machine learning model prior to generating the one or more predetermined motion time system (PMTS) representations of the one or more tasks. For training the machine learning model, the training subsystem 214 is initially configured to obtain the one or more description datasets including at least one of: the one or more text representations, the one or more image representations, and one or more video representations, and the one or more computer-aided design (CAD) representations, corresponding to the one or more tasks associated with the one or more jobs.

The training subsystem 214 is further configured to obtain the one or more pairwise datasets comprising the one or more jobs in the one or more descriptions datasets and the one or more predetermined motion time system (PMTS) symbol streams associated with the one or more tasks. The training subsystem 214 is further configured to add the one or more description datasets with the one or more pairwise datasets, using the mixer. The training subsystem 214 is further configured to train the machine learning model to generate the one or more first vector representations of the one or more description data corresponding to the one or more tasks. In other words, the machine learning model is trained to generate embeddings or the one or more first vector representations where the position of the vector corresponding to an input carries semantic meaning (e.g. two nearby vector maybe similar in meaning whereas two far away vectors may be very different). In an embodiment, the machine learning model may have never been trained on any data directly relevant to work representation and PMTS representation. In another embodiment, the machine learning model may be trained on similar kinds of tasks.

In an embodiment, the one or more vector representations are numerical representations where one or more positions of one or more vectors corresponding to at least one of: the one or more description datasets and the one or more pairwise datasets, carrying one or more semantic meanings. In an embodiment, the machine learning model may have never been trained on any data directly relevant to work representation and PMTS representation. In an embodiment, the machine learning model may have been trained on similar kinds of tasks. The training subsystem 214 is further configured to store a pair of the one or more description datasets of the one or more tasks associated with the one or more jobs and the one or more predetermined motion time system (PMTS) symbol streams, and the one or more first vector representations, in the one or more vector databases.

The plurality of subsystems 114 further includes the insights generating subsystem 210 that is communicatively connected to the one or more hardware processors 110. The insights generating subsystem 210 is configured to generate the one or more insights corresponding to the one or more tasks associated with the one or more jobs, based on the one or more predetermined motion time system (PMTS) representations of the one or more tasks associated with the one or more jobs, using the machine learning model.

In an embodiment, the one or more insights corresponding to the one or more tasks associated with the one or more jobs, may include at least one of: the time assigned to the one or more tasks associated with the one or more jobs, the one or more motion types during performing the tasks, the one or more ergonomic risk factors due to the performance of the one or more tasks, and the one or more recommendations of productivity in the one or more jobs. In an embodiment, the one or more insights may be ergonomic analyses (e.g., estimation of metabolic stress for individual steps or entire process or a assessments similar to Rapid Entire Body Assessment (REBA), Rapid Upper Limb Assessment (RULA), National Institute for Occupational Safety and Health (NIOSH) Lifting Equation Analysis, Snook table Analysis, Hand Strain Index analysis, and the like), and productivity related analysis (e.g., timing estimates for the work corresponding to the PMTS representation, or need for work area or worker headcount, quality-related analysis e.g. Process Failure Modes and Effects Analysis (P-FMEAs), and the like).

In an embodiment of the present disclosure, the training subsystem 214 is configured to train the machine learning model prior to generating the one or more insights corresponding to the one or more tasks associated with the one or more jobs. For training the machine learning model, the training subsystem 214 is initially configured to obtain one or more first datasets including the one or more predetermined motion time system (PMTS) representations of the one or more tasks associated with the one or more jobs. In an embodiment, the one or more predetermined motion time system (PMTS) representations may be accompanied by corresponding auxiliary data (e.g., the load a worker is lifting while performing a given step). The training subsystem 214 is further configured to obtain one or more second datasets comprising the one or more insights from the one or more predetermined motion time systems (PMTS).

The training subsystem 214 is further configured to add the one or more first datasets with the one or more second datasets, using the mixer. The training subsystem 214 is further configured to train the machine learning model to determine one or more second optimized weights for the machine learning model, based on the addition of the one or more first datasets and the one or more second datasets, using the optimizer with one or more objective functions. The training subsystem 214 is further configured to generate the one or more insights corresponding to the one or more tasks associated with the one or more jobs, based on the trained machine learning model with the determined one or more second optimized weights.

Upon training the machine learning model, the trained machine learning model is utilized by the insights generating subsystem 210 for generating the one or more insights corresponding to the one or more tasks associated with the one or more jobs. The insights generating subsystem 210 is initially configured to obtain one or more second information comprising the one or more predetermined motion time system (PMTS) representations of the one or more tasks associated with the one or more jobs. The insights generating subsystem 210 is further configured to obtain one or more third information including one or more details of how one or more predetermined motion time system (PMTS) representations are converted to the one or more insights as one or more second prompts within a second context window.

The insights generating subsystem 210 is further configured to add the one or more second information with the one or more third information, using the mixer. The insights generating subsystem 210 is further configured to apply the addition of the one or more second information with the one or more third information, into the machine learning model. In an embodiment, the machine learning model may be at least one of: the large language model (LLM), the vision language model (VLM), and the like. The insights generating subsystem 210 is further configured to generate the one or more insights corresponding to the one or more tasks associated with the one or more jobs, based on the machine learning model trained on the one or more second information including the one or more predetermined motion time system (PMTS) representations of the one or more tasks associated with the one or more jobs.

In an embodiment of the present disclosure, for generating the one or more insights from the one or more Predetermined Motion Time System (PMTS) representations, the insights generating subsystem 210 is configured to obtain the one or more second information comprising the one or more predetermined motion time system (PMTS) representations of the one or more tasks associated with the one or more jobs. The insights generating subsystem 210 is further configured to generate one or more second vector representations of the one or more second information comprising the one or more predetermined motion time system (PMTS) representations of the one or more tasks associated with the one or more jobs, using the machine learning model.

The insights generating subsystem 210 is further configured to determine one or more second nearest neighbors associated with the one or more insights by comparing one or more second vector representations of the one or more second information, with one or more second original representations of the one or more insights stored in the one or more vector databases. The insights generating subsystem 210 is further configured to generate the one or more insights corresponding to the one or more tasks associated with the one or more jobs, based on the determination of the one or more second nearest neighbors associated with the one or more insights.

The training subsystem 214 is configured to train the machine learning model prior to generating the one or more insights corresponding to the one or more tasks associated with the one or more jobs. For training the machine learning model, the training subsystem 214 is initially configured to obtain the one or more first datasets including the one or more predetermined motion time system (PMTS) representations of the one or more tasks associated with the one or more jobs. The training subsystem 214 is further configured to obtain the one or more second datasets including the one or more insights from the one or more predetermined motion time systems (PMTS).

The training subsystem 214 is further configured to add the one or more first datasets with the one or more second datasets, using the mixer. The training subsystem 214 is further configured to train/fine-tune the machine learning model to generate the one or more second vector representations of the one or more first datasets including the one or more predetermined motion time system (PMTS) representations of the one or more tasks associated with the one or more jobs. In an embodiment, the machine learning model may be a generic word-2-vector like model trained on one or more generic datasets. The training subsystem 214 is further configured to store a pair of the one or more predetermined motion time system (PMTS) representations of the one or more tasks associated with the one or more jobs and the one or more insights, and the one or more second vector representations, in the one or more vector databases.

The plurality of subsystems 114 further includes the Predetermined Motion Time System (PMTS) representation converting subsystem 212. The Predetermined Motion Time System (PMTS) representation converting subsystem 212 is configured to convert the one or more predetermined motion time system (PMTS) representations to the one or more second predetermined motion time system (PMTS) representations, using the machine learning model. In an embodiment, the Predetermined Motion Time System (PMTS) representation converting subsystem 212 is configured to provide one or more alternate conversion/translation. In another embodiment, the Predetermined Motion Time System (PMTS) representation converting subsystem 212 is configured to provide justifications for different alternative conversions/translations.

In an embodiment of the present disclosure, the training subsystem 214 is configured to train the machine learning model prior to converting the one or more predetermined motion time system (PMTS) representations to the one or more second predetermined motion time system (PMTS) representations. For training the machine learning model, the training subsystem 214 is initially configured to obtain the one or more first datasets including the one or more predetermined motion time system (PMTS) representations of the one or more tasks associated with the one or more jobs. The training subsystem 214 is further configured to obtain the one or more third datasets including the one or more second predetermined motion time system (PMTS) representations of the one or more tasks associated with the one or more jobs. In an embodiment, the one or more third datasets are pairwise datasets corresponding to the one or more second datasets.

The training subsystem 214 is further configured to add the one or more first datasets with the one or more third datasets, using the mixer. The training subsystem 214 is further configured to train the machine learning model to determine one or more third optimized weights for the machine learning model, based on the addition of the one or more first datasets and the one or more third datasets, using the optimizer with one or more objective functions. The training subsystem 214 is further configured to convert the one or more predetermined motion time system (PMTS) representations to the one or more second predetermined motion time system (PMTS) representations, using the machine learning model.

Upon training the machine learning model, the trained machine learning model is utilized by the Predetermined Motion Time System (PMTS) representation converting subsystem 212, for converting the one or more predetermined motion time system (PMTS) representations to the one or more second predetermined motion time system (PMTS) representations. The Predetermined Motion Time System (PMTS) representation converting subsystem 212 is initially configured to obtain the one or more first datasets including the one or more predetermined motion time system (PMTS) representations of the one or more tasks associated with the one or more jobs. The Predetermined Motion Time System (PMTS) representation converting subsystem 212 is further configured to obtain one or more fourth information including one or more details of how one or more predetermined motion time system (PMTS) representations are converted to the one or more second predetermined motion time system (PMTS) representations as one or more third prompts within a third context window.

The Predetermined Motion Time System (PMTS) representation converting subsystem 212 is further configured to add the one or more first datasets with the one or more fourth information, using the mixer. The Predetermined Motion Time System (PMTS) representation converting subsystem 212 is further configured to apply the addition of the one or more first datasets with the one or more fourth information, into the machine learning model. The Predetermined Motion Time System (PMTS) representation converting subsystem 212 is further configured to convert the one or more predetermined motion time system (PMTS) representations to the one or more second predetermined motion time system (PMTS) representations, based on the machine learning model trained on the one or more general purpose data.

In an embodiment of the present disclosure, for converting the one or more predetermined motion time system (PMTS) representations to the one or more second predetermined motion time system (PMTS) representations, the Predetermined Motion Time System (PMTS) representation converting subsystem 212 is initially configured to obtain the one or more first datasets including the one or more predetermined motion time system (PMTS) representations of the one or more tasks associated with the one or more jobs. The Predetermined Motion Time System (PMTS) representation converting subsystem 212 is further configured to generate one or more third vector representations of the one or more first datasets including the one or more predetermined motion time system (PMTS) representations of the one or more tasks associated with the one or more jobs, using the machine learning model.

The Predetermined Motion Time System (PMTS) representation converting subsystem 212 is further configured to determine one or more third nearest neighbors associated with the one or more predetermined motion time system (PMTS) representations of the one or more tasks associated with the one or more jobs, by comparing one or more third vector representations of the one or more first datasets, with one or more third original representations of the one or more predetermined motion time system (PMTS) representations stored in the one or more vector databases. The Predetermined Motion Time System (PMTS) representation converting subsystem 212 is further configured to convert the one or more predetermined motion time system (PMTS) representations to the one or more second predetermined motion time system (PMTS) representations, based on the determination of the one or more third nearest neighbors associated with the one or more predetermined motion time system (PMTS) representations of the one or more tasks associated with the one or more jobs.

The training subsystem 214 is configured to train the machine learning model prior to converting the one or more predetermined motion time system (PMTS) representations to the one or more second predetermined motion time system (PMTS) representations. For training the machine learning model, the training subsystem 214 is initially configured to obtain the one or more first datasets including the one or more predetermined motion time system (PMTS) representations of the one or more tasks associated with the one or more jobs. The training subsystem 214 is further configured to obtain the one or more third datasets including the one or more second predetermined motion time system (PMTS) representations of the one or more tasks associated with the one or more jobs.

The training subsystem 214 is further configured to add the one or more first datasets with the one or more third datasets, using the mixer. The training subsystem 214 is further configured to train the machine learning model to generate the one or more third vector representations of at least one of: the one or more first datasets, and the one or more third datasets. The training subsystem 214 is further configured to store a pair of the one or more predetermined motion time system (PMTS) representations of the one or more tasks associated with the one or more jobs and the one or more second predetermined motion time system (PMTS) representations of the one or more tasks associated with the one or more jobs, and the one or more third vector representations, in the one or more vector databases.

Figure 3:
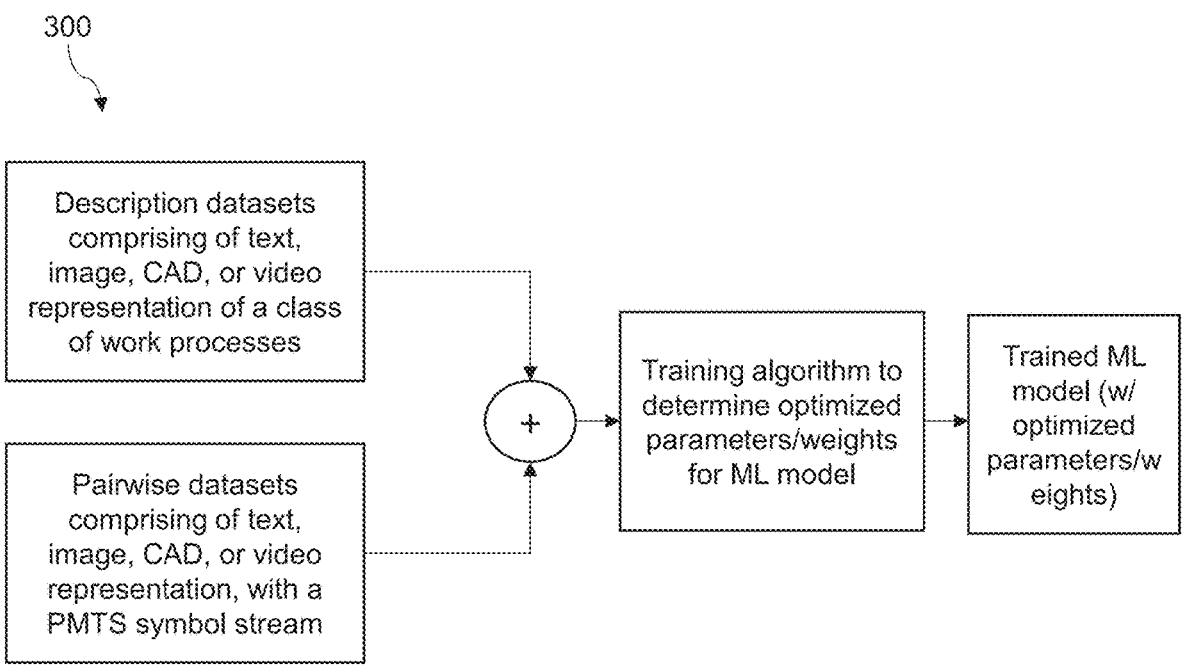
FIG. 3 is a process flow of training a machine learning model for generating the one or more predetermined motion time system (PMTS) representations of the one or more tasks associated with the one or more jobs, in accordance with an embodiment of the present disclosure.

FIG. 3 is a process flow 300 of training the machine learning model for generating the one or more predetermined motion time system (PMTS) representations of the one or more tasks associated with the one or more jobs, in accordance with an embodiment of the present disclosure. The details of the training process of the machine learning model for generating the one or more predetermined motion time system (PMTS) representations of the one or more tasks associated with the one or more jobs, have been elaborated in FIG. 2.

Figure 4:
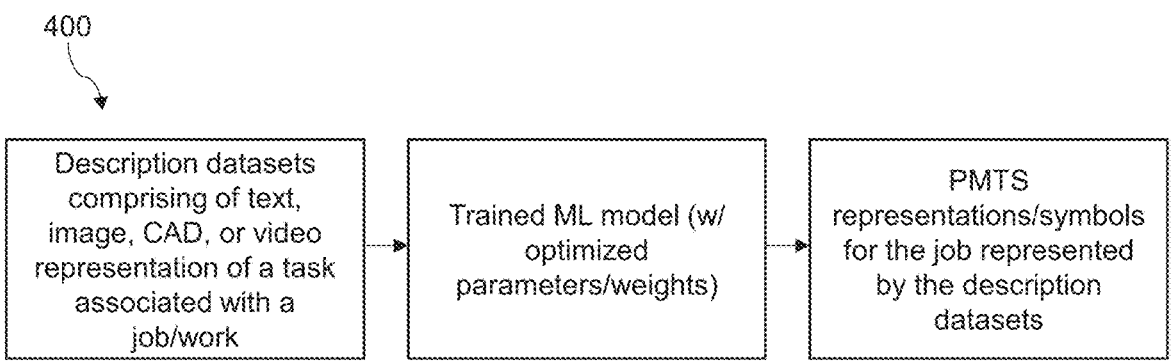
FIG. 4 is a process flow of generation of the one or more predetermined motion time system (PMTS) representations of the one or more tasks associated with the one or more jobs, using the trained machine learning model, in accordance with an embodiment of the present disclosure.

FIG. 4 is a process flow 400 of generation of the one or more predetermined motion time system (PMTS) representations of the one or more tasks associated with the one or more jobs, using the trained machine learning model, in accordance with an embodiment of the present disclosure. The details of the generation of the one or more predetermined motion time system (PMTS) representations corresponding to the one or more tasks associated with the one or more jobs, using the trained machine learning model, have been elaborated in FIG. 2.

Figure 5:
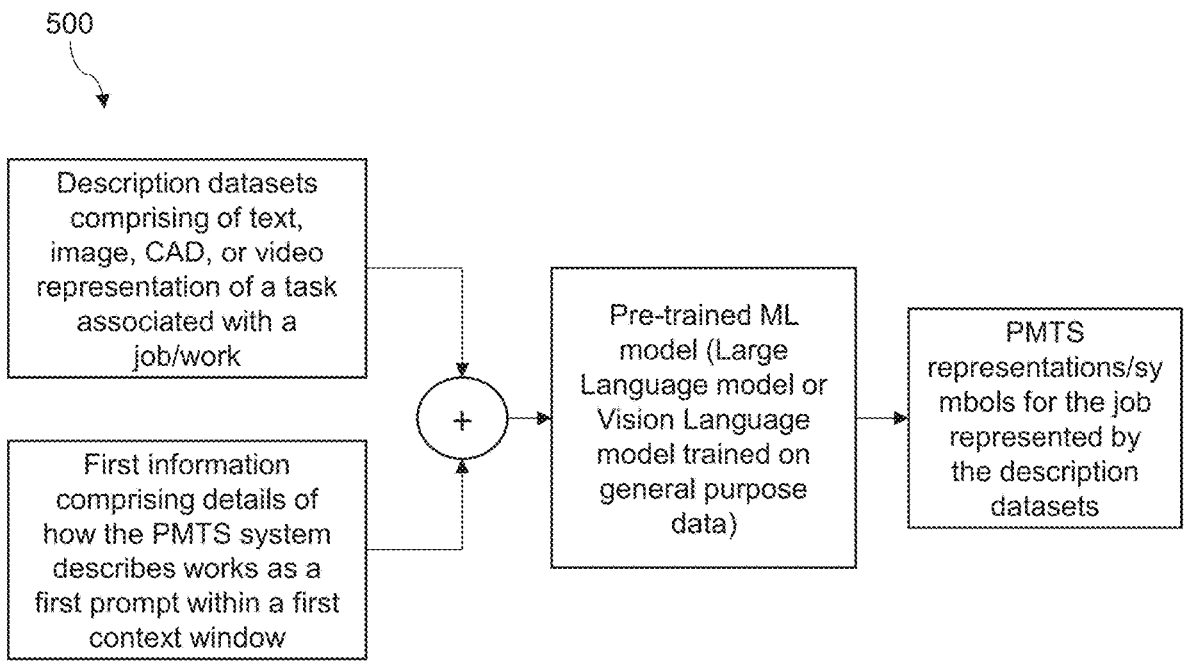
FIG. 5 is a process flow of generation of the one or more predetermined motion time system (PMTS) representations of the one or more tasks associated with the one or more jobs, using the trained machine learning model, in accordance with an embodiment of the present disclosure.

FIG. 5 is a process flow 500 of generation of the one or more predetermined motion time system (PMTS) representations of the one or more tasks associated with the one or more jobs, using the trained machine learning model, in accordance with an embodiment of the present disclosure. The details of the generation of the one or more predetermined motion time system (PMTS) representations corresponding to the one or more tasks associated with the one or more jobs, using the trained machine learning model, have been elaborated in FIG. 2.

Figure 6:
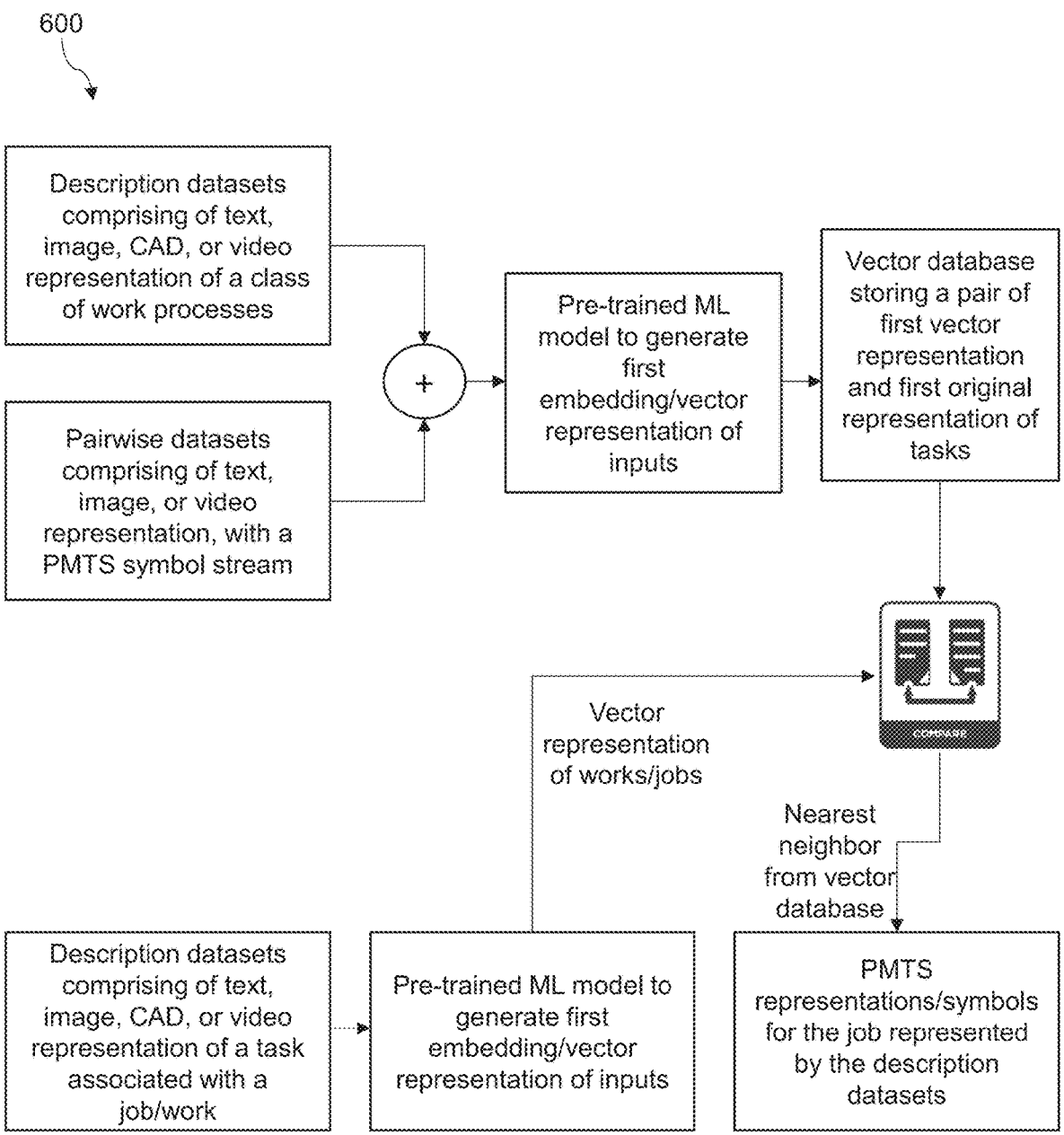
FIG. 6 is a process flow of generation of the one or more predetermined motion time system (PMTS) representations of the one or more tasks associated with the one or more jobs, using the trained machine learning model, in accordance with an embodiment of the present disclosure.

FIG. 6 is a process flow 600 of generation of the one or more predetermined motion time system (PMTS) representations of the one or more tasks associated with the one or more jobs, using the trained machine learning model, in accordance with an embodiment of the present disclosure. The details of the generation of the one or more predetermined motion time system (PMTS) representations of the one or more tasks associated with the one or more jobs, using the trained machine learning model, have been elaborated in FIG. 2.

Figure 7:
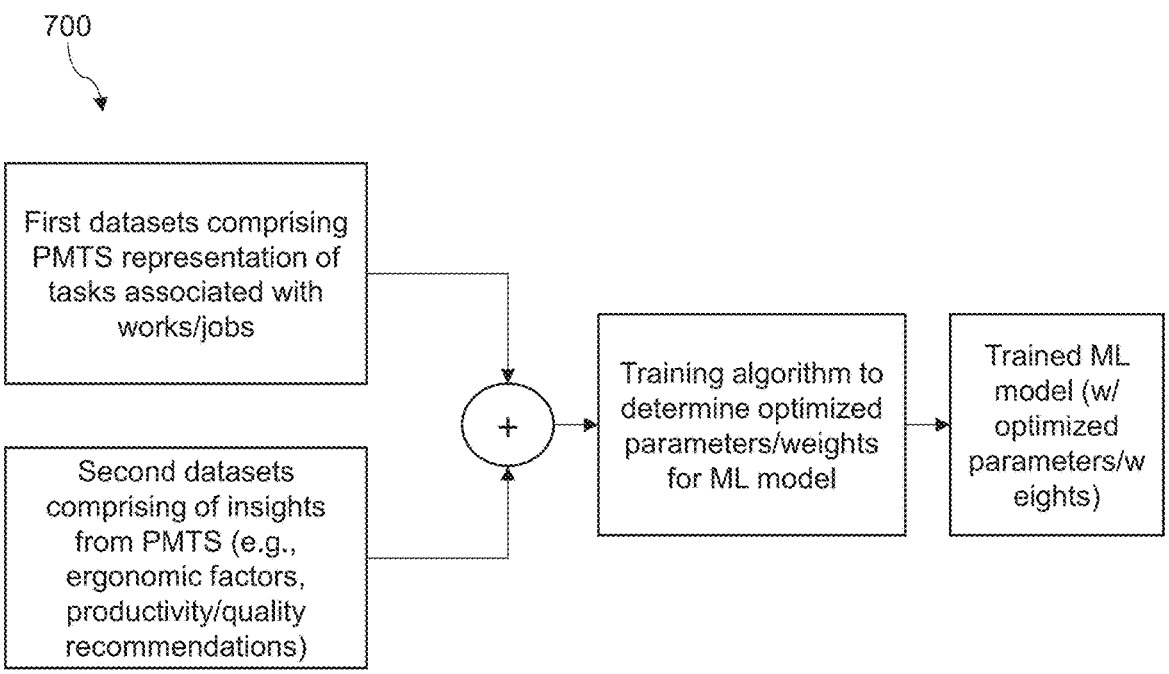
FIG. 7 is a process flow of training the machine learning model for generating one or more insights corresponding to the one or more tasks associated with the one or more jobs based on the one or more predetermined motion time system (PMTS) representations, in accordance with an embodiment of the present disclosure.

FIG. 7 is a process flow 700 of training the machine learning model for generating one or more insights corresponding to the one or more tasks associated with the one or more jobs based on the one or more predetermined motion time system (PMTS) representations, in accordance with an embodiment of the present disclosure. The details of training of the machine learning model for generating one or more insights corresponding to the one or more tasks associated with the one or more jobs based on the one or more predetermined motion time system (PMTS) representations, have been elaborated in FIG. 2.

Figure 8:
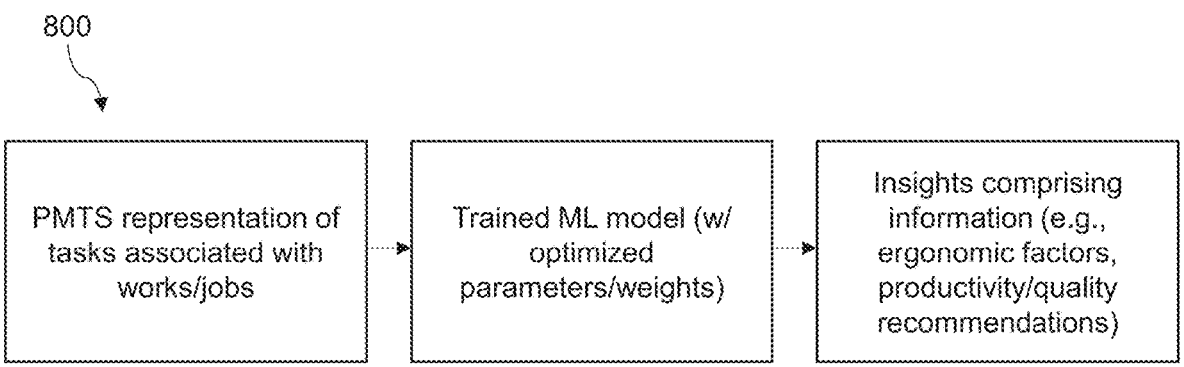
FIG. 8 is a process flow of generation of the one or more insights corresponding to the one or more tasks associated with the one or more jobs based on the one or more predetermined motion time system (PMTS) representations, using the trained machine learning model, in accordance with an embodiment of the present disclosure.

FIG. 8 is a process flow 800 of generation of the one or more insights corresponding to the one or more tasks associated with the one or more jobs based on the one or more predetermined motion time system (PMTS) representations, using the trained machine learning model, in accordance with an embodiment of the present disclosure. The details of generation of the one or more insights corresponding to the one or more tasks associated with the one or more jobs based on the one or more predetermined motion time system (PMTS) representations, using the trained machine learning model, have been elaborated in FIG. 2.

Figure 9:
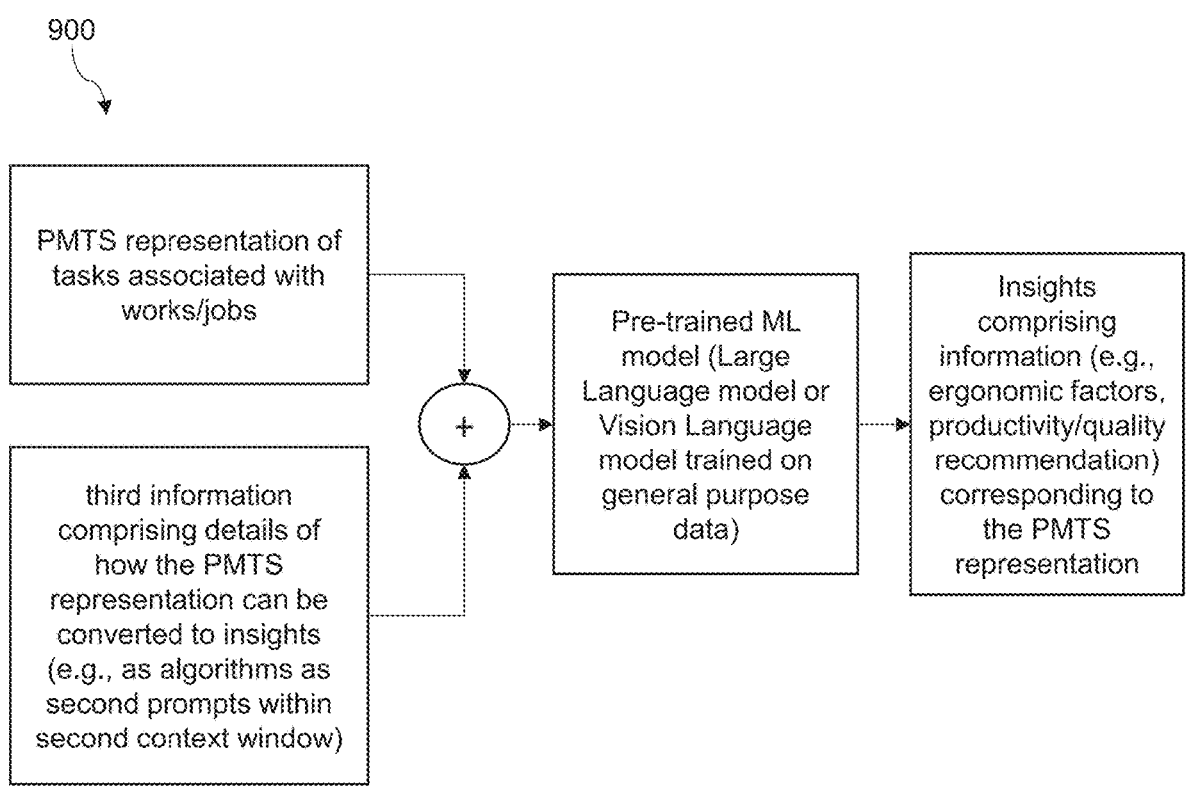
FIG. 9 is a process flow of generation of the one or more insights corresponding to the one or more tasks associated with the one or more jobs based on the one or more predetermined motion time system (PMTS) representations, using the trained machine learning model, in accordance with an embodiment of the present disclosure.

FIG. 9 is a process flow 900 of generation of the one or more insights corresponding to the one or more tasks associated with the one or more jobs based on the one or more predetermined motion time system (PMTS) representations, using the trained machine learning model, in accordance with an embodiment of the present disclosure. The details of the generation of the one or more insights corresponding to the one or more tasks associated with the one or more jobs based on the one or more predetermined motion time system (PMTS) representations, using the trained machine learning model, have been elaborated in FIG. 2.

Figure 10:
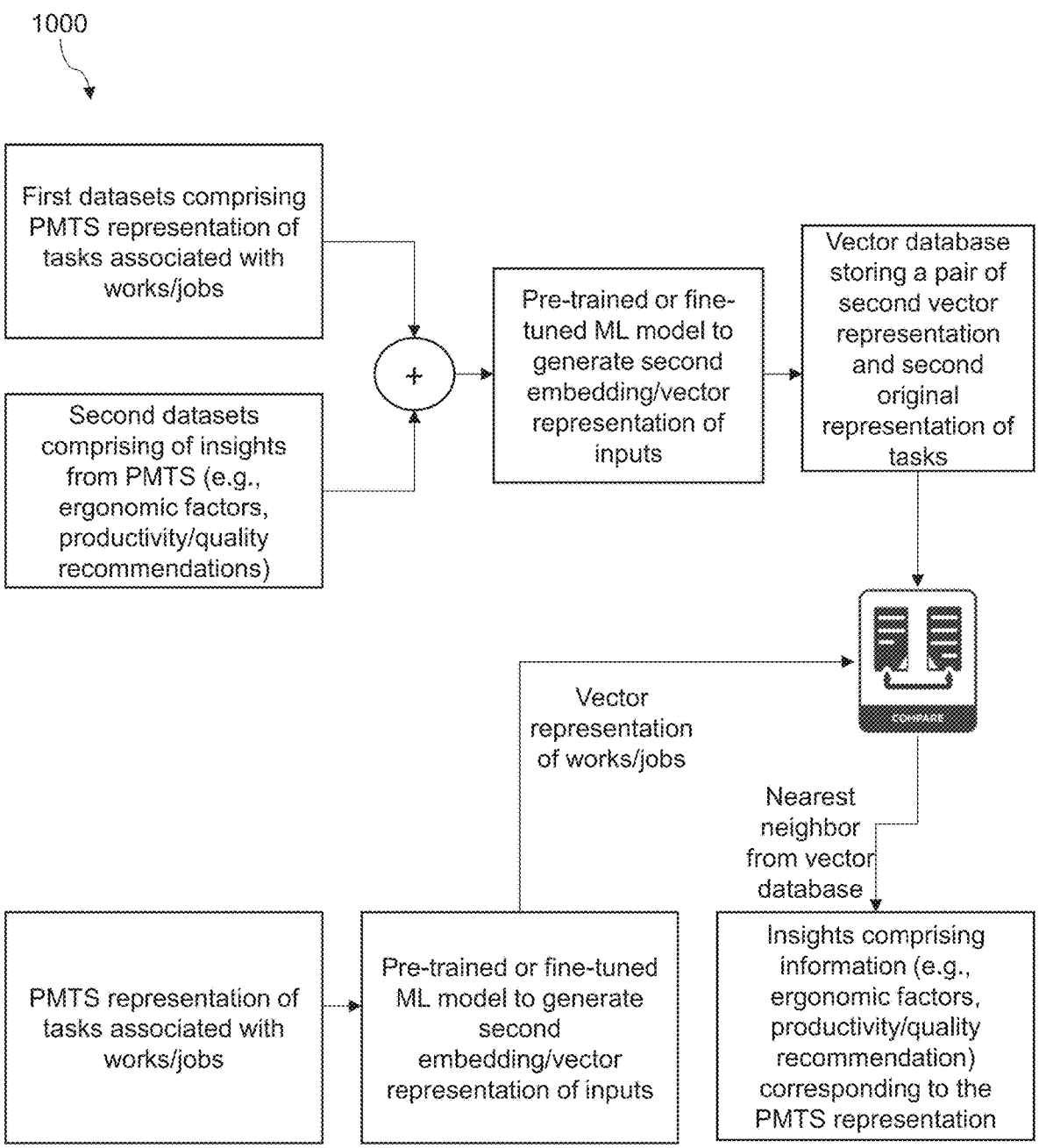
FIG. 10 is a process flow of generation of the one or more insights corresponding to the one or more tasks associated with the one or more jobs based on the one or more predetermined motion time system (PMTS) representations, using the trained machine learning model, in accordance with an embodiment of the present disclosure.

FIG. 10 is a process flow 1000 of generation of the one or more insights corresponding to the one or more tasks associated with the one or more jobs based on the one or more predetermined motion time system (PMTS) representations, using the trained machine learning model, in accordance with an embodiment of the present disclosure. The details of the generation of the one or more insights corresponding to the one or more tasks associated with the one or more jobs based on the one or more predetermined motion time system (PMTS) representations, using the trained machine learning model, have been elaborated in FIG. 2.

Figure 11:
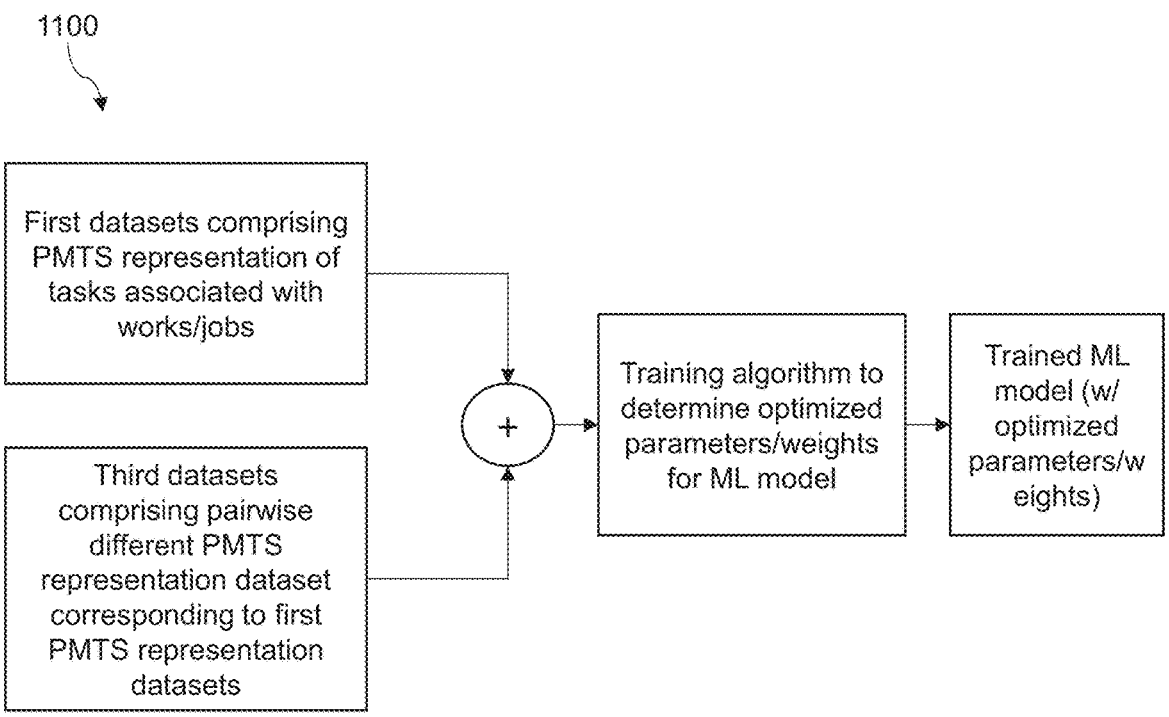
FIG. 11 is a process flow of training the machine learning model for converting the one or more predetermined motion time system (PMTS) representations to another predetermined motion time system (PMTS) representations (e.g., one or more second predetermined motion time system (PMTS) representations), in accordance with an embodiment of the present disclosure.

FIG. 11 is a process flow 1100 of training the machine learning model for converting the one or more predetermined motion time system (PMTS) representations to another predetermined motion time system (PMTS) representations (e.g., one or more second predetermined motion time system (PMTS) representations), in accordance with an embodiment of the present disclosure. The details of the training process of the machine learning model for converting the one or more predetermined motion time system (PMTS) representations to the one or more second predetermined motion time system (PMTS) representations, have been elaborated in FIG. 2.

Figure 12:
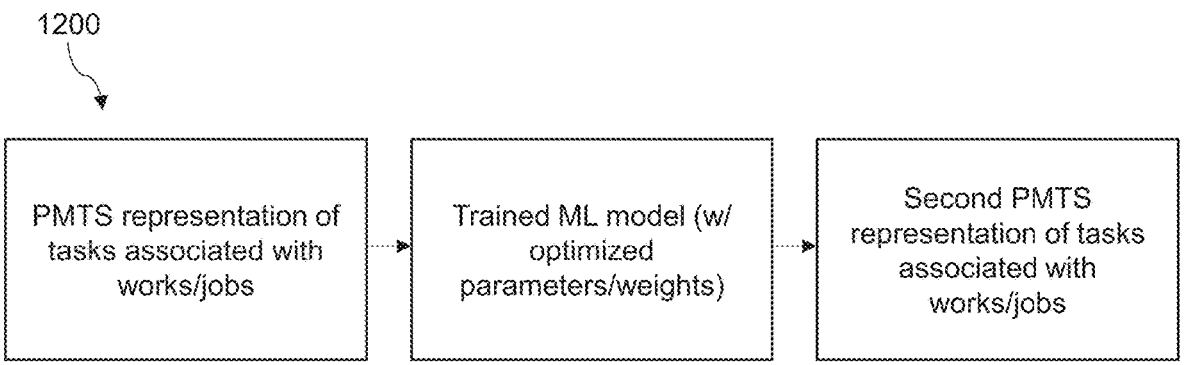
FIG. 12 is a process flow of conversion of the one or more predetermined motion time system (PMTS) representations to the one or more second predetermined motion time system (PMTS) representations, using the trained machine learning model, in accordance with an embodiment of the present disclosure.

FIG. 12 is a process flow 1200 of conversion of the one or more predetermined motion time system (PMTS) representations to the one or more second predetermined motion time system (PMTS) representations, using the trained machine learning model, in accordance with an embodiment of the present disclosure. The details of the conversion of the one or more predetermined motion time system (PMTS) representations to the one or more second predetermined motion time system (PMTS) representations, have been elaborated in FIG. 2.

Figure 13:
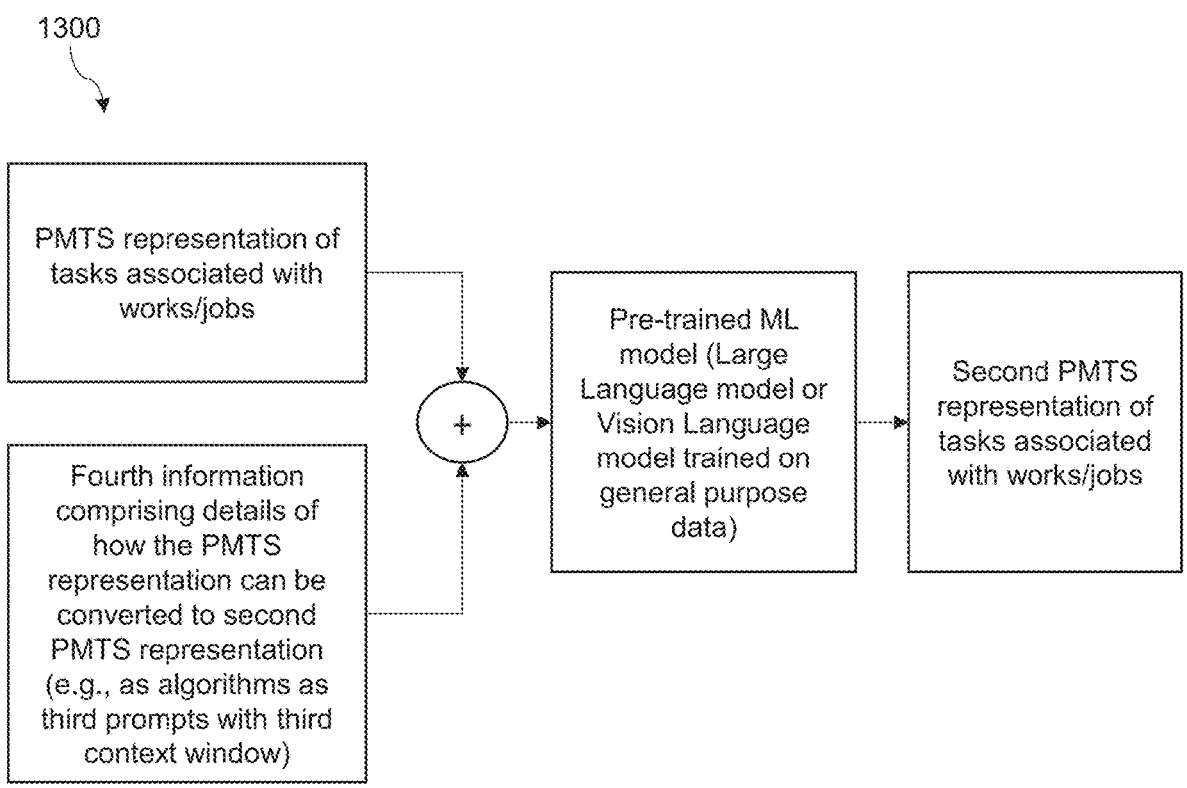
FIG. 13 is a process flow of conversion of the one or more predetermined motion time system (PMTS) representations to the one or more second predetermined motion time system (PMTS) representations, using the trained machine learning model, in accordance with an embodiment of the present disclosure.

FIG. 13 is a process flow 1300 of conversion of the one or more predetermined motion time system (PMTS) representations to the one or more second predetermined motion time system (PMTS) representations, using the trained machine learning model, in accordance with an embodiment of the present disclosure. The details of the conversion of the one or more predetermined motion time system (PMTS) representations to the one or more second predetermined motion time system (PMTS) representations, using the trained machine learning model, have been elaborated in FIG. 2.

Figure 14:
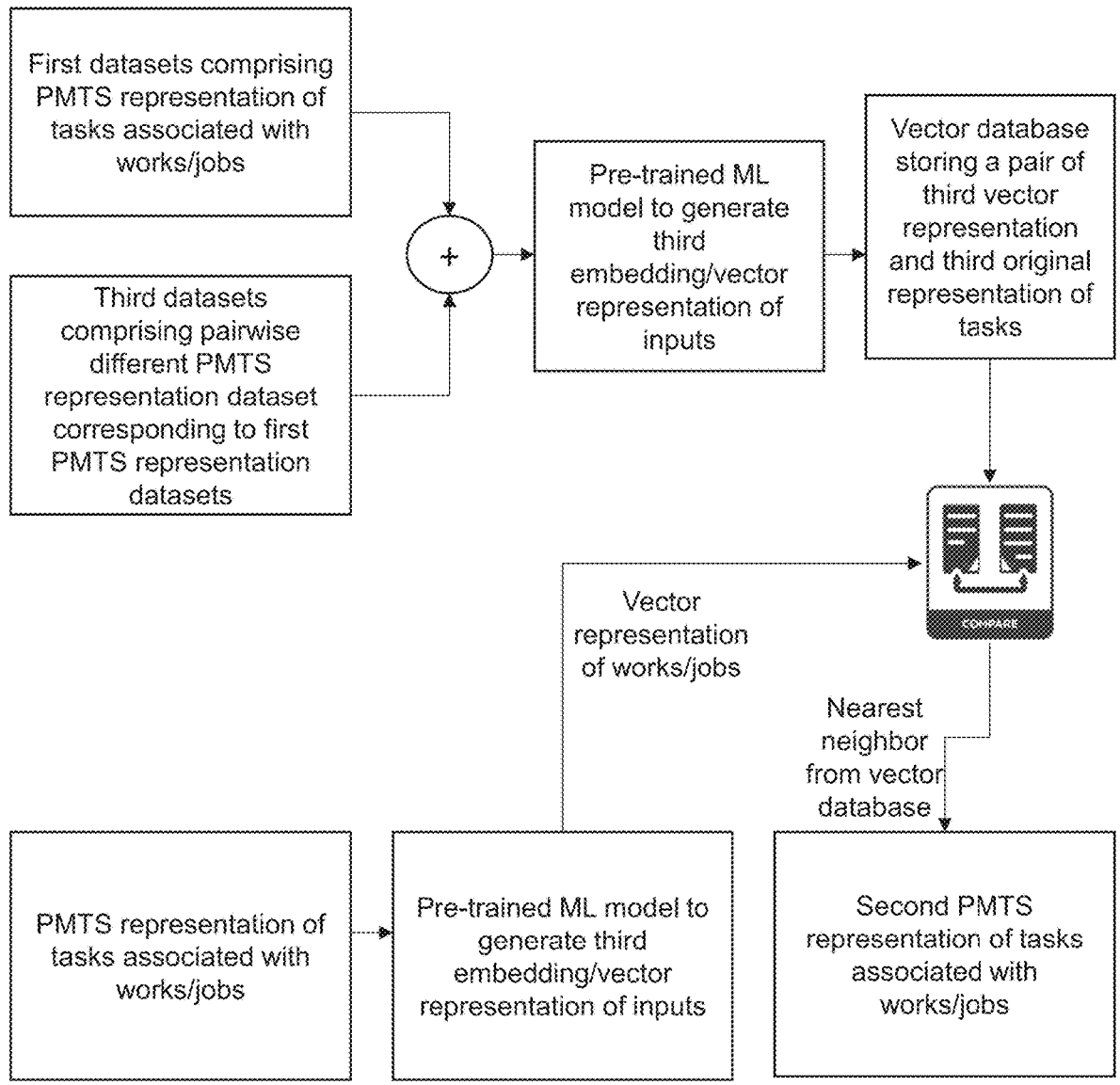
FIG. 14 is a process flow of conversion of the one or more predetermined motion time system (PMTS) representations to the one or more second predetermined motion time system (PMTS) representations), using the trained machine learning model, in accordance with an embodiment of the present disclosure.

FIG. 14 is a process flow 1400 of conversion of the one or more predetermined motion time system (PMTS) representations to the one or more second predetermined motion time system (PMTS) representations), using the trained machine learning model, in accordance with an embodiment of the present disclosure. The details of the conversion of the one or more predetermined motion time system (PMTS) representations to the one or more second predetermined motion time system (PMTS) representations), using the trained machine learning model, have been elaborated in FIG. 2.

Figure 15:
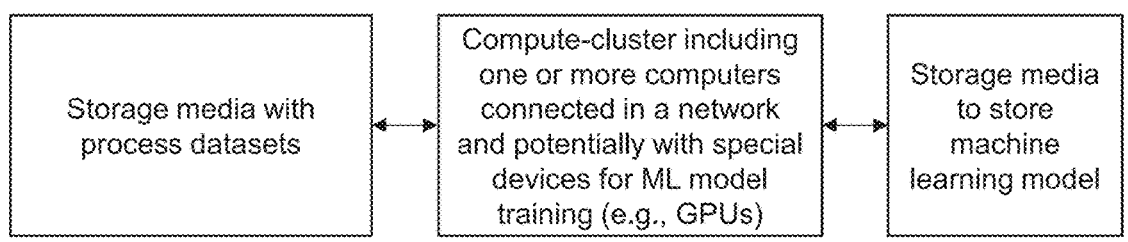
FIG. 15-16 are process flows illustrating a physical implementation of the ML-based system with the trained machine learning model, in accordance with an embodiment of the present disclosure.
Figure 16:
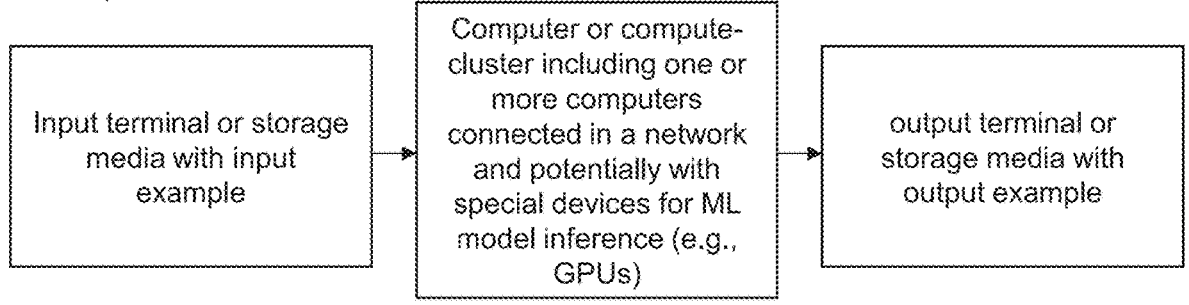

FIG. 15-16 are process flows illustrating a physical implementation of the ML-based system with the trained machine learning model, in accordance with an embodiment of the present disclosure. The storage media, as shown in FIG. 15, may have one or more storage devices or the one or more databases 104 where one or more datasets of work processes are stored. The one or more datasets may include data associated with at least one of: text, video, image, and PMTS symbols, used for training and inference. A network of computers, as shown in FIG. 15, equipped with one or more graphics processing units (GPUs), used for training the machine learning models. This infrastructure supports parallel processing and accelerates the training process for large datasets. The storage media may further include the devices and databases 108 where the machine learning models are configured and stored. The machine learning models are used for inference once the training process is completed.

An input terminal, as shown in FIG. 16, is configured to receive the one or more input data (e.g., work description data). The one or more input data are processed by the machine learning model to generate one or more outputs. The network of computers, as shown in FIG. 16, is used for running the trained machine learning models to generate predictions. This infrastructure supports efficient inference, enabling real-time or batch processing of the one or more input data. An output terminal, as shown in FIG. 16, is configured to store the output examples. These outputs are the result of processing input examples through the trained machine learning model.

Figure 17:
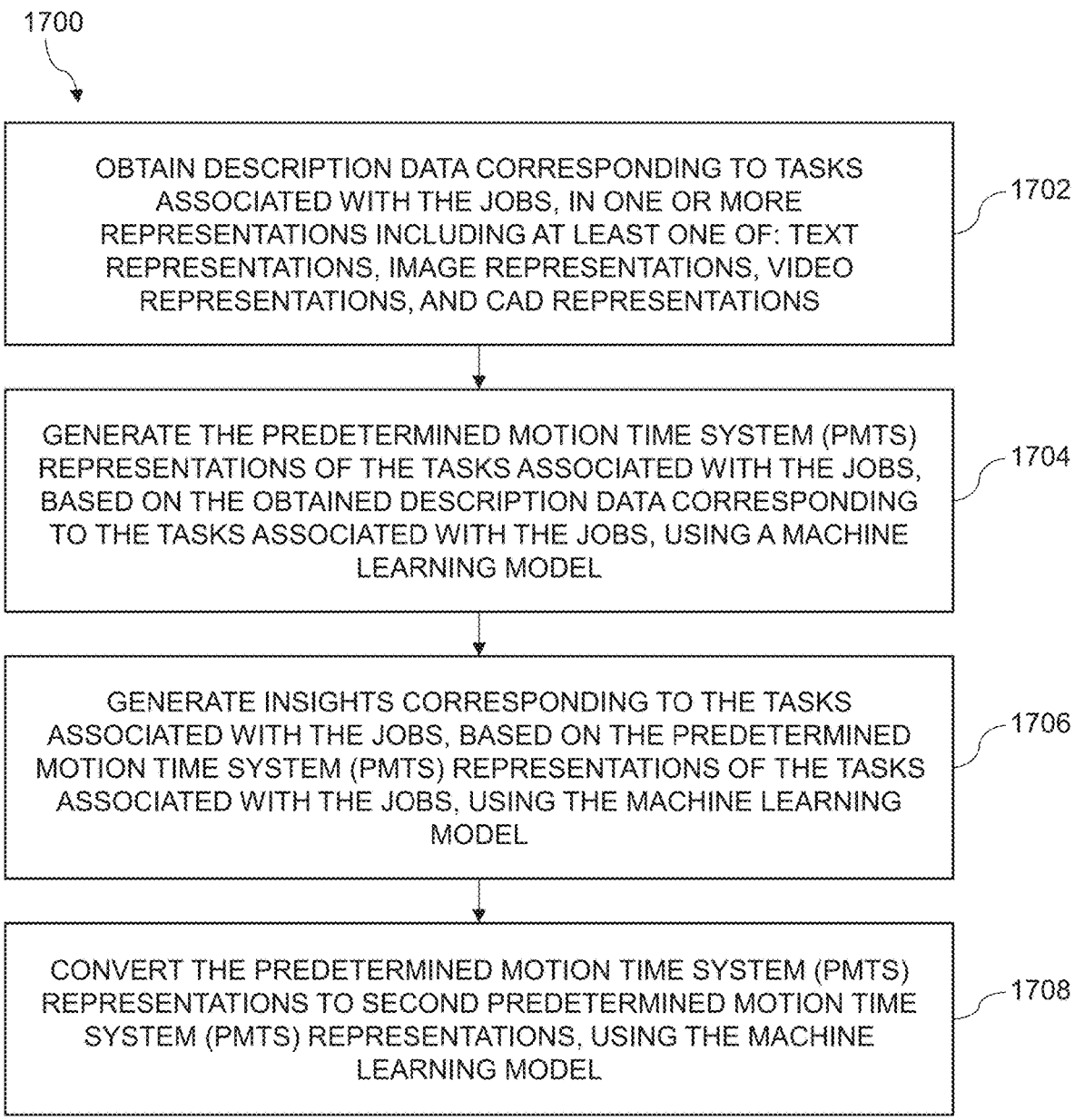
FIG. 17 is a flow chart illustrating a machine-learning based (ML-based) method for optimizing work/job efficiency based on generation of the one or more predetermined motion time system (PMTS) representations for the one or more tasks associated with the one or more jobs, in accordance with an embodiment of the present disclosure.

FIG. 17 is an flow chart illustrating a machine-learning based (ML-based) method 1700 for optimizing work/job efficiency based on generation of the one or more predetermined motion time system (PMTS) representations for the one or more tasks associated with the one or more jobs, in accordance with an embodiment of the present disclosure.

At step 1702, the one or more description data corresponding to the one or more tasks associated with the one or more jobs, in one or more representations including at least one of: the one or more text representations, the one or more image representations, the one or more video representations, and the one or more computer-aided design (CAD) representations, are obtained.

At step 1704, the one or more predetermined motion time system (PMTS) representations of the one or more tasks associated with the one or more jobs, are generated based on the obtained one or more description data corresponding to the one or more tasks associated with the one or more jobs, using the machine learning model.

At step 1706, the one or more insights corresponding to the one or more tasks associated with the one or more jobs, are generated based on the one or more predetermined motion time system (PMTS) representations of the one or more tasks associated with the one or more jobs, using the machine learning model. In an embodiment, the one or more insights corresponding to the one or more tasks associated with the one or more jobs, include at least one of: the time assigned to the one or more tasks associated with the one or more jobs, the one or more motion types during performing the tasks, the one or more ergonomic risk factors due to the performance of the one or more tasks, and the one or more recommendations of productivity in the one or more jobs.

At step 1708, the one or more predetermined motion time system (PMTS) representations are converted to one or more second predetermined motion time system (PMTS) representations, using the machine learning model.

The present invention has following advantages. The present invention with the ML-based system 102 is configured to generate the one or more Predetermined Motion Time System (PMTS) representations from any kind of work in one or more representations including at least one of: the one or more text representations, the one or more video representations, the one or more image representations, and the one or more computer-aided design (CAD) representations. The present invention with the ML-based system 102 is further configured to extract value (i.e., the one or more insights) from the one or more Predetermined Motion Time System (PMTS) representations to optimize worker productivity, safety, and quality. The present invention with the ML-based system 102 is further configured to convert one Predetermined Motion Time System (PMTS) representations to another Predetermined Motion Time System (PMTS) representations.

The present invention is configured to utilize the machine learning models, trained on comprehensive datasets, to perform conversions between different PMTS representations and to derive actionable recommendations for work improvements. The present invention is configured to utilize both algorithmic and deep learning techniques, including the large language model and the vision language model, to ensure accurate and efficient translation of work processes into the PMTS symbols and subsequent analyses. The integrated ML-based system provides a versatile tool for users (e.g., industrial engineers and managers) to optimize operational standards and worker well-being in various industrial settings.

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

The embodiments herein can comprise hardware and software elements. The embodiments that are implemented in software include but are not limited to, firmware, resident software, microcode, etc. The functions performed by various modules described herein may be implemented in other modules or combinations of other modules. For the purposes of this description, a computer-usable or computer-readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory, magnetic tape, a removable computer diskette, a random-access memory (RAM), a read-only memory (ROM), a rigid magnetic disk and an optical disk. Current examples of optical disks include compact disk-read only memory (CD-ROM), compact disk-read/write (CD-R/W) and DVD.

Input/output (I/O) devices (including but not limited to keyboards, displays, pointing devices, etc.) can be coupled to the ML-based system 102 either directly or through intervening I/O controllers. Network adapters may also be coupled to the ML-based system 102 to enable the data processing system to become coupled to other data processing systems or remote printers or storage devices through intervening private or public networks. Modems, cable modem and Ethernet cards are just a few of the currently available types of network adapters.

A representative hardware environment for practicing the embodiments may include a hardware configuration of an information handling/ML-based system 102 in accordance with the embodiments herein. The ML-based system 102 herein comprises at least one processor or central processing unit (CPU). The CPUs are interconnected via the system bus 202 to various devices including at least one of: a random-access memory (RAM), read-only memory (ROM), and an input/output (I/O) adapter. The I/O adapter can connect to peripheral devices, including at least one of: disk units and tape drives, or other program storage devices that are readable by the ML-based system 102. The ML-based system 102 can read the inventive instructions on the program storage devices and follow these instructions to execute the methodology of the embodiments herein.

The ML-based system 102 further includes a user interface adapter that connects a keyboard, mouse, speaker, microphone, and/or other user interface devices including a touch screen device (not shown) to the bus to gather user input. Additionally, a communication adapter connects the bus to a data processing network, and a display adapter connects the bus to a display device which may be embodied as an output device including at least one of: a monitor, printer, or transmitter, for example.

A description of an embodiment with several components in communication with each other does not imply that all such components are required. On the contrary, a variety of optional components are described to illustrate the wide variety of possible embodiments of the invention. When a single device or article is described herein, it will be apparent that more than one device/article (whether or not they cooperate) may be used in place of a single device/article. Similarly, where more than one device or article is described herein (whether or not they cooperate), it will be apparent that a single device/article may be used in place of the more than one device or article, or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open-ended in that an item or items following any one of these words is not meant to be an exhaustive listing of such item or items or meant to be limited to only the listed item or items. It must also be noted that as used herein and in the appended claims, the singular forms "a," "an," and "the" include plural references unless the context clearly dictates otherwise.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that are issued on an application based here on. Accordingly, the embodiments of the present invention are intended to be illustrative, but not limiting, of the scope of the invention, which is set forth in the following claims.

We claim:

1. A machine learning based (ML-based) method for optimizing real-time job efficiency based on generation of one or more predetermined motion time system (PMTS) representations for one or more tasks associated with one or more jobs, the machine learning based (ML-based) method comprising:

obtaining, by one or more hardware processors, one or more description data corresponding to the one or more tasks associated with the one or more jobs, in one or more representations comprising at least one of: one or more text representations, one or more image representations, one or more video representations, and one or more computer-aided design (CAD) representations;

generating, by the one or more hardware processors, the one or more predetermined motion time system (PMTS) representations of the one or more tasks associated with the one or more jobs, based on the obtained one or more description data corresponding to the one or more tasks associated with the one or more jobs, using the machine learning model, wherein generating the one or more predetermined motion time system (PMTS) representations of the one or more tasks associated with the one or more jobs, comprises:

generating, by the one or more hardware processors, one or more first vector representations of the one or more description data corresponding to the one or more tasks associated with the one or more jobs, using the machine learning model, wherein the one or more first vector representations are numerical embeddings that encode semantic relationships between task descriptions and predetermined motion time system (PMTS) representations;

determining, by the one or more hardware processors, one or more first nearest neighbors associated with the one or more tasks by comparing the generated one or more first vector representations of the one or more description data corresponding to the one or more tasks, with one or more first original representations of the one or more tasks stored in one or more vector databases; and generating, by the one or more hardware processors, the one or more predetermined motion time system (PMTS) representations of the one or more tasks associated with the one or more jobs, based on the determination of the one or more first nearest neighbors associated with the one or more tasks, wherein the one or more predetermined motion time system (PMTS) representations include at least one of: modular arrangement systems, time measurement methods, operational sequence techniques, and representations derived from motion time systems, wherein the one or more predetermined motion time system (PMTS) representations are expressed as at least one of: pseudo-code, and full code, implemented in one or more programming languages;

generating, by the one or more hardware processors, one or more insights corresponding to the one or more tasks associated with the one or more jobs, based on the one or more predetermined motion time system (PMTS) representations of the one or more tasks associated with the one or more jobs, using the machine learning model, wherein generating the one or more insights corresponding to the one or more tasks associated with the one or more jobs, comprises:

obtaining, by the one or more hardware processors, one or more second information comprising the one or more predetermined motion time system (PMTS) representations of the one or more tasks associated with the one or more jobs;

generating, by the one or more hardware processors, one or more second vector representations of the one or more second information comprising the one or more predetermined motion time system (PMTS) representations of the one or more tasks associated with the one or more jobs, using the machine learning model;

determining, by the one or more hardware processors, one or more second nearest neighbors associated with the one or more insights by comparing one or more second vector representations of the one or more second information, with one or more second original representations of the one or more insights stored in the one or more vector databases; and generating, by the one or more hardware processors, the one or more insights corresponding to the one or more tasks associated with the one or more jobs, based on the determination of the one or more second nearest neighbors associated with the one or more insights, wherein the machine learning model comprises at least one of: a linear regression model, a logistic regression model, a decision tree model, a random forest model, a support vector machines (SVM) model, and a neural network model, and wherein the machine learning model is trained using meta-learning, wherein the one or more insights corresponding to the one or more tasks associated with the one or more jobs, comprise at least one of: time assigned to the one or more tasks associated with the one or more jobs, one or more motion types during performing the tasks, one or more ergonomic risk factors due to the performance of the one or more tasks, and one or more recommendations of productivity in the one or more jobs, wherein the one or more insights include ergonomic analyses and productivity related analyses, wherein the ergonomic analyses include standardized analysis frameworks including at least one of: full-body and upper-limb risk assessments, and lifting guidelines, wherein the productivity related analyses include quality related analysis and process reliability evaluations; and converting, by the one or more hardware processors, the one or more predetermined motion time system (PMTS) representations to one or more second predetermined motion time system (PMTS) representations, using the machine learning model.

2. The machine learning based (ML-based) method of claim 1, further comprising training, by the one or more hardware processors, the machine learning model, wherein training the machine learning model comprises:

obtaining, by the one or more hardware processors, one or more description datasets comprising at least one of: the one or more text representations, the one or more image representations, the one or more video representations, and the one or more computer-aided design (CAD) representations, corresponding to the one or more tasks associated with the one or more jobs;

obtaining, by the one or more hardware processors, the one or more pairwise datasets comprising the one or more jobs in the one or more descriptions datasets and the one or more predetermined motion time system (PMTS) symbol streams associated with the one or more tasks;

adding, by the one or more hardware processors, the one or more description datasets with the one or more pairwise datasets, using a mixer;

training, by the one or more hardware processors, the machine learning model to determine one or more first optimized weights for the machine learning model, based on the addition of the one or more description datasets and the one or more pairwise datasets, using the optimizer with the one or more objective functions; and generating, by the one or more hardware processors, the one or more predetermined motion time system (PMTS) representations of the one or more tasks associated with the one or more jobs, based on the trained machine learning model with the determined one or more first optimized weights.

3. The machine learning based (ML-based) method of claim 1, wherein generating the one or more predetermined motion time system (PMTS) representations of the one or more tasks associated with the one or more jobs, comprises:

obtaining, by the one or more hardware processors, the one or more description data corresponding to the one or more tasks associated with the one or more jobs, in one or more representations comprising at least one of: the one or more text representations, the one or more image representations, the one or more video representations, and the one or more computer-aided design (CAD) representations;

obtaining, by the one or more hardware processors, one or more first information comprising one or more details of how one or more predetermined motion time systems (PMTS) describing the one or more jobs as one or more first prompts within a first context window;

adding, by the one or more hardware processors, the one or more description data corresponding to the one or more tasks associated with the one or more jobs, with the one or more first information, using the mixer;

applying, by the one or more hardware processors, the addition of the one or more description data corresponding to the one or more tasks associated with the one or more jobs, with the one or more first information, into the machine learning model, wherein the machine learning model is trained for conversion of the one or more tasks associated with the one or more jobs, to the one or more predetermined motion time system (PMTS) representations, and wherein the machine learning model is trained on one or more internal data to determine one or more subsequent words associated with the one or more tasks; and generating, by the one or more hardware processors, the one or more predetermined motion time system (PMTS) representations of the one or more tasks associated with the one or more jobs, based on the machine learning model trained on one or more general purpose data.

4. The machine learning based (ML-based) method of claim 1, further comprising training, by the one or more hardware processors, the machine learning model, wherein training the machine learning model comprises:

obtaining, by the one or more hardware processors, the one or more description datasets comprising at least one of: the one or more text representations, the one or more image representations, the one or more video representations, and the one or more computer-aided design (CAD) representations, corresponding to the one or more tasks associated with the one or more jobs;

obtaining, by the one or more hardware processors, the one or more pairwise datasets comprising the one or more jobs in the one or more descriptions datasets and the one or more predetermined motion time system (PMTS) symbol streams associated with the one or more tasks;

adding, by the one or more hardware processors, the one or more description datasets with the one or more pairwise datasets, using the mixer;

training, by the one or more hardware processors, the machine learning model to generate the one or more first vector representations of the one or more description data corresponding to the one or more tasks, wherein the one or more vector representations are numerical representations where one or more positions of one or more vectors corresponding to at least one of: the one or more description datasets and the one or more pairwise datasets, carrying one or more semantic meanings; and storing, by the one or more hardware processors, a pair of the one or more description datasets of the one or more tasks associated with the one or more jobs and the one or more predetermined motion time system (PMTS) symbol streams, and the one or more first vector representations, in the one or more vector databases.

5. The machine learning based (ML-based) method of claim 1, further comprising:

obtaining, by the one or more hardware processors, one or more first datasets comprising the one or more predetermined motion time system (PMTS) representations of the one or more tasks associated with the one or more jobs;

obtaining, by the one or more hardware processors, one or more second datasets comprising the one or more insights from the one or more predetermined motion time systems (PMTS);

adding, by the one or more hardware processors, the one or more first datasets with the one or more second datasets, using the mixer;

training, by the one or more hardware processors, the machine learning model to determine one or more second optimized weights for the machine learning model, based on the addition of the one or more first datasets and the one or more second datasets, using the optimizer with one or more objective functions; and generating, by the one or more hardware processors, the one or more insights corresponding to the one or more tasks associated with the one or more jobs, based on the trained machine learning model with the determined one or more second optimized weights.

6. The machine learning based (ML-based) method of claim 1, wherein generating the one or more insights corresponding to the one or more tasks associated with the one or more jobs, comprises:

obtaining, by the one or more hardware processors, one or more second information comprising the one or more predetermined motion time system (PMTS) representations of the one or more tasks associated with the one or more jobs;

obtaining, by the one or more hardware processors, one or more third information comprising one or more details of how one or more predetermined motion time system (PMTS) representations are converted to the one or more insights as one or more second prompts within a second context window;

adding, by the one or more hardware processors, the one or more second information with the one or more third information, using the mixer;

applying, by the one or more hardware processors, the addition of the one or more second information with the one or more third information, into the machine learning model; and generating, by the one or more hardware processors, the one or more insights corresponding to the one or more tasks associated with the one or more jobs, based on the machine learning model trained on the one or more second information comprising the one or more predetermined motion time system (PMTS) representations of the one or more tasks associated with the one or more jobs.

7. The machine learning based (ML-based) method of claim 1, further comprising training, by the one or more hardware processors, the machine learning model, wherein training the machine learning model comprises:

obtaining, by the one or more hardware processors, the one or more first datasets comprising the one or more predetermined motion time system (PMTS) representations of the one or more tasks associated with the one or more jobs;

obtaining, by the one or more hardware processors, the one or more second datasets comprising the one or more insights from the one or more predetermined motion time systems (PMTS);

adding, by the one or more hardware processors, the one or more first datasets with the one or more second datasets, using the mixer;

training, by the one or more hardware processors, the machine learning model to generate the one or more second vector representations of the one or more first datasets comprising the one or more predetermined motion time system (PMTS) representations of the one or more tasks associated with the one or more jobs; and storing, by the one or more hardware processors, a pair of the one or more predetermined motion time system (PMTS) representations of the one or more tasks associated with the one or more jobs and the one or more insights, and the one or more second vector representations, in the one or more vector databases.

8. The machine learning based (ML-based) method of claim 1, further comprising:

obtaining, by the one or more hardware processors, the one or more first datasets comprising the one or more predetermined motion time system (PMTS) representations of the one or more tasks associated with the one or more jobs;

obtaining, by the one or more hardware processors, the one or more third datasets comprising the one or more second predetermined motion time system (PMTS) representations of the one or more tasks associated with the one or more jobs, wherein the one or more third datasets are pairwise datasets corresponding to the one or more second datasets;

adding, by the one or more hardware processors, the one or more first datasets with the one or more third datasets, using the mixer;

training, by the one or more hardware processors, the machine learning model to determine one or more third optimized weights for the machine learning model, based on the addition of the one or more first datasets and the one or more third datasets, using the optimizer with one or more objective functions; and converting, by the one or more hardware processors, the one or more predetermined motion time system (PMTS) representations to the one or more second predetermined motion time system (PMTS) representations, using the machine learning model.

9. The machine learning based (ML-based) method of claim 1, wherein converting the one or more predetermined motion time system (PMTS) representations to the one or more second predetermined motion time system (PMTS) representations, comprises:

obtaining, by the one or more hardware processors, the one or more first datasets comprising the one or more predetermined motion time system (PMTS) representations of the one or more tasks associated with the one or more jobs;

obtaining, by the one or more hardware processors, one or more fourth information comprising one or more details of how one or more predetermined motion time system (PMTS) representations are converted to the one or more second predetermined motion time system (PMTS) representations as one or more third prompts within a third context window;

adding, by the one or more hardware processors, the one or more first datasets with the one or more fourth information, using the mixer;

applying, by the one or more hardware processors, the addition of the one or more first datasets with the one or more fourth information, into the machine learning model; and converting, by the one or more hardware processors, the one or more predetermined motion time system (PMTS) representations to the one or more second predetermined motion time system (PMTS) representations, based on the machine learning model trained on the one or more general purpose data.

10. The machine learning based (ML-based) method of claim 1, wherein converting the one or more predetermined motion time system (PMTS) representations to the one or more second predetermined motion time system (PMTS) representations, comprises:

obtaining, by the one or more hardware processors, the one or more first datasets comprising the one or more predetermined motion time system (PMTS) representations of the one or more tasks associated with the one or more jobs;

generating, by the one or more hardware processors, one or more third vector representations of the one or more first datasets comprising the one or more predetermined motion time system (PMTS) representations of the one or more tasks associated with the one or more jobs, using the machine learning model;

determining, by the one or more hardware processors, one or more third nearest neighbors associated with the one or more predetermined motion time system (PMTS) representations of the one or more tasks associated with the one or more jobs, by comparing one or more third vector representations of the one or more first datasets, with one or more third original representations of the one or more predetermined motion time system (PMTS) representations stored in the one or more vector databases; and converting, by the one or more hardware processors, the one or more predetermined motion time system (PMTS) representations to the one or more second predetermined motion time system (PMTS) representations, based on the determination of the one or more third nearest neighbors associated with the one or more predetermined motion time system (PMTS) representations of the one or more tasks associated with the one or more jobs.

11. The machine learning based (ML-based) method of claim 10, further comprising training, by the one or more hardware processors, the machine learning model, wherein training the machine learning model comprises:
   obtaining, by the one or more hardware processors, the one or more first datasets comprising the one or more predetermined motion time system (PMTS) representations of the one or more tasks associated with the one or more jobs;
   obtaining, by the one or more hardware processors, the one or more third datasets comprising the one or more second predetermined motion time system (PMTS) representations of the one or more tasks associated with the one or more jobs;
   adding, by the one or more hardware processors, the one or more first datasets with the one or more third datasets, using the mixer;
   training, by the one or more hardware processors, the machine learning model to generate the one or more third vector representations of at least one of: the one or more first datasets, and the one or more third datasets; and
   storing, by the one or more hardware processors, a pair of the one or more predetermined motion time system (PMTS) representations of the one or more tasks associated with the one or more jobs and the one or more second predetermined motion time system (PMTS) representations of the one or more tasks associated with the one or more jobs, and the one or more third vector representations, in the one or more vector databases.

12. A machine learning based (ML-based) system for optimizing real-time job efficiency based on generation of one or more predetermined motion time system (PMTS) representations for one or more tasks associated with one or more jobs, the machine learning based (ML-based) system comprising:
   one or more hardware processors; and
   a memory coupled to the one or more hardware processors, wherein the memory comprises a plurality of subsystems in form of programmable instructions executable by the one or more hardware processors, and wherein the plurality of subsystems comprises:
      a data obtaining subsystem configured to obtain one or more description data corresponding to the one or more tasks associated with the one or more jobs, in one or more representations comprising at least one of: one or more text representations, one or more image representations, one or more video representations, and one or more computer-aided design (CAD) representations;
      a predetermined motion time system (PMTS) representation generating subsystem configured to generate the one or more predetermined motion time system (PMTS) representations of the one or more tasks associated with the one or more jobs, based on the obtained one or more description data corresponding to the one or more tasks associated with the one or more jobs, using a machine learning model, wherein in generating the one or more predetermined motion time system (PMTS) representations of the one or more tasks associated with the one or more jobs, the predetermined motion time system (PMTS) representation generating subsystem is configured to:
         generate one or more first vector representations of the one or more description data corresponding to the one or more tasks associated with the one or more jobs, using the machine learning model, wherein the one or more first vector representations are numerical embeddings that encode semantic relationships between task descriptions and predetermined motion time system (PMTS) representations;
         determine one or more first nearest neighbors associated with the one or more tasks by comparing the generated one or more first vector representations of the one or more description data corresponding to the one or more tasks, with one or more first original representations of the one or more tasks stored in one or more vector databases; and
         generate the one or more predetermined motion time system (PMTS) representations of the one or more tasks associated with the one or more jobs, based on the determination of the one or more first nearest neighbors associated with the one or more tasks,
         wherein the one or more predetermined motion time system (PMTS) representations include at least one of: modular arrangement systems, time measurement methods, operational sequence techniques, and representations derived from motion time systems,
         wherein the one or more predetermined motion time system (PMTS) representations are expressed as at least one of: pseudo-code, and full code, implemented in one or more programming languages;
      an insights generating subsystem configured to generate one or more insights corresponding to the one or more tasks associated with the one or more jobs, based on the one or more predetermined motion time system (PMTS) representations of the one or more tasks associated with the one or more jobs, using the machine learning model, wherein generating the one or more insights corresponding to the one or more tasks associated with the one or more jobs, comprises:
         obtaining, by the one or more hardware processors, one or more second information comprising the one or more predetermined motion time system (PMTS) representations of the one or more tasks associated with the one or more jobs;
         generating, by the one or more hardware processors, one or more second vector representations of the one or more second information comprising the one or more predetermined motion time system (PMTS) representations of the one or more tasks associated with the one or more jobs, using the machine learning model;
         determining, by the one or more hardware processors, one or more second nearest neighbors associated with the one or more insights by comparing one or more second vector representations of the one or more second information, with one or more second original representations of the one or more insights stored in the one or more vector databases; and
         generating, by the one or more hardware processors, the one or more insights corresponding to the one or more tasks associated with the one or more jobs, based on the determination of the one or more second nearest neighbors associated with the one or more insights, wherein the machine learning model comprises at least one of: a linear regression model, a logistic regression model, a decision tree model, a random forest model, a support vector machines (SVM) model, and a neural network model, wherein the machine learning model is trained using meta-learning, wherein the one or more insights corresponding to the one or more tasks associated with the one or more jobs, comprise at least one of: time assigned to the one or more tasks associated with the one or more jobs, one or more motion types during performing the tasks, one or more ergonomic risk factors due to the performance of the one or more tasks, and one or more recommendations of productivity in the one or more jobs, wherein the one or more insights include ergonomic analyses and productivity related analyses, wherein the ergonomic analyses include standardized analysis frameworks including at least one of: full-body and upper-limb risk assessments, and lifting guidelines, wherein the productivity related analyses include quality related analysis and process reliability evaluations; and a predetermined motion time system (PMTS) representation converting subsystem configured to convert the one or more predetermined motion time system (PMTS) representations to one or more second predetermined motion time system (PMTS) representations, using the machine learning model.

13. The machine learning based (ML-based) system of claim 12, further comprising a training subsystem configured to train the machine learning model, wherein in training the machine learning model, the training subsystem is configured to:

obtain one or more description datasets comprising at least one of: the one or more text representations, the one or more image representations, the one or more video representations, and the one or more computer-aided design (CAD) representations, corresponding to the one or more tasks associated with the one or more jobs;

obtain the one or more pairwise datasets comprising the one or more jobs in the one or more descriptions datasets and the one or more predetermined motion time system (PMTS) symbol streams associated with the one or more tasks;

add the one or more description datasets with the one or more pairwise datasets, using a mixer;

train the machine learning model to determine one or more first optimized weights for the machine learning model, based on the addition of the one or more description datasets and the one or more pairwise datasets, using the optimizer with the one or more objective functions; and generate the one or more predetermined motion time system (PMTS) representations of the one or more tasks associated with the one or more jobs, based on the trained machine learning model with the determined one or more first optimized weights.

14. The machine learning based (ML-based) system of claim 12, wherein in generating the one or more predetermined motion time system (PMTS) representations of the one or more tasks associated with the one or more jobs, the predetermined motion time system (PMTS) representation generating subsystem is configured to:

obtain the one or more description data corresponding to the one or more tasks associated with the one or more jobs, in one or more representations comprising at least one of: the one or more text representations, the one or more image representations, the one or more video representations, and the one or more computer-aided design (CAD) representations;

obtain one or more first information comprising one or more details of how one or more predetermined motion time systems (PMTS) describing the one or more jobs as one or more first prompts within a first context window;

add the one or more description data corresponding to the one or more tasks associated with the one or more jobs, with the one or more first information, using the mixer;

apply the addition of the one or more description data corresponding to the one or more tasks associated with the one or more jobs, with the one or more first information, into the machine learning model, wherein the machine learning model is trained for conversion of the one or more tasks associated with the one or more jobs, to the one or more predetermined motion time system (PMTS) representations, and wherein the machine learning model is trained on one or more internal data to determine one or more subsequent words associated with the one or more tasks; and generate the one or more predetermined motion time system (PMTS) representations of the one or more tasks associated with the one or more jobs, based on the machine learning model trained on one or more general purpose data.

15. The machine learning based (ML-based) system of claim 13, wherein the training subsystem is further configured to:

obtain one or more first datasets comprising the one or more predetermined motion time system (PMTS) representations of the one or more tasks associated with the one or more jobs;

obtain one or more second datasets comprising the one or more insights from the one or more predetermined motion time systems (PMTS);

add the one or more first datasets with the one or more second datasets, using the mixer;

train the machine learning model to determine one or more second optimized weights for the machine learning model, based on the addition of the one or more first datasets and the one or more second datasets, using the optimizer with one or more objective functions; and generate the one or more insights corresponding to the one or more tasks associated with the one or more jobs, based on the trained machine learning model with the determined one or more second optimized weights.

16. The machine learning based (ML-based) system of claim 12, wherein in generating the one or more insights corresponding to the one or more tasks associated with the one or more jobs, the insights generating subsystem is configured to:

obtain one or more second information comprising the one or more predetermined motion time system (PMTS) representations of the one or more tasks associated with the one or more jobs;

obtain one or more third information comprising one or more details of how one or more predetermined motion time system (PMTS) representations are converted to the one or more insights as one or more second prompts within a second context window;

add the one or more second information with the one or more third information, using the mixer;

apply the addition of the one or more second information with the one or more third information, into the machine learning model; and generate the one or more insights corresponding to the one or more tasks associated with the one or more jobs, based on the machine learning model trained on the one or more second information comprising the one or more predetermined motion time system (PMTS) representations of the one or more tasks associated with the one or more jobs.

17. A non-transitory computer-readable storage medium having instructions stored therein that when executed by one or more hardware processors, cause the one or more hardware processors to execute operations of:

obtaining one or more description data corresponding to the one or more tasks associated with the one or more jobs, in one or more representations comprising at least one of: one or more text representations, one or more image representations, one or more video representations, and one or more computer-aided design (CAD) representations;

generating the one or more predetermined motion time system (PMTS) representations of the one or more tasks associated with the one or more jobs, based on the obtained one or more description data corresponding to the one or more tasks associated with the one or more jobs, using the machine learning model, wherein generating the one or more predetermined motion time system (PMTS) representations of the one or more tasks associated with the one or more jobs, comprises:

generating, by the one or more hardware processors, one or more first vector representations of the one or more description data corresponding to the one or more tasks associated with the one or more jobs, using the machine learning model, wherein the one or more first vector representations are numerical embeddings that encode semantic relationships between task descriptions and predetermined motion time system (PMTS) representations;

determining, by the one or more hardware processors, one or more first nearest neighbors associated with the one or more tasks by comparing the generated one or more first vector representations of the one or more description data corresponding to the one or more tasks, with one or more first original representations of the one or more tasks stored in one or more vector databases; and generating, by the one or more hardware processors, the one or more predetermined motion time system (PMTS) representations of the one or more tasks associated with the one or more jobs, based on the determination of the one or more first nearest neighbors associated with the one or more tasks, wherein the one or more predetermined motion time system (PMTS) representations include at least one of: modular arrangement systems, time measurement methods, operational sequence techniques, and representations derived from motion time systems, wherein the one or more predetermined motion time system (PMTS) representations are expressed as at least one of: pseudo-code, and full code, implemented in one or more programming languages;

generating one or more insights corresponding to the one or more tasks associated with the one or more jobs, based on the one or more predetermined motion time system (PMTS) representations of the one or more tasks associated with the one or more jobs, using the machine learning model, wherein generating the one or more insights corresponding to the one or more tasks associated with the one or more jobs, comprises:

obtaining, by the one or more hardware processors, one or more second information comprising the one or more predetermined motion time system (PMTS) representations of the one or more tasks associated with the one or more jobs;

generating, by the one or more hardware processors, one or more second vector representations of the one or more second information comprising the one or more predetermined motion time system (PMTS) representations of the one or more tasks associated with the one or more jobs, using the machine learning model;

determining, by the one or more hardware processors, one or more second nearest neighbors associated with the one or more insights by comparing one or more second vector representations of the one or more second information, with one or more second original representations of the one or more insights stored in the one or more vector databases; and generating, by the one or more hardware processors, the one or more insights corresponding to the one or more tasks associated with the one or more jobs, based on the determination of the one or more second nearest neighbors associated with the one or more insights, wherein the machine learning model comprises at least one of: a linear regression model, a logistic regression model, a decision tree model, a random forest model, a support vector machines (SVM) model, and a neural network model, and wherein the machine learning model is trained using meta-learning, wherein the one or more insights corresponding to the one or more tasks associated with the one or more jobs, comprise at least one of: time assigned to the one or more tasks associated with the one or more jobs, one or more motion types during performing the tasks, one or more ergonomic risk factors due to the performance of the one or more tasks, and one or more recommendations of productivity in the one or more jobs, wherein the one or more insights include ergonomic analyses and productivity related analyses, wherein the ergonomic analyses include standardized analysis frameworks including at least one of: full-body and upper-limb risk assessments, and lifting guidelines, wherein the productivity related analyses include quality related analysis and process reliability evaluations; and converting the one or more predetermined motion time system (PMTS) representations to one or more second predetermined motion time system (PMTS) representations, using the machine learning model.

* * * * *